United States Patent
Machkaoutsan et al.

(10) Patent No.: US 11,690,210 B2
(45) Date of Patent: Jun. 27, 2023

(54) THREE-DIMENSIONAL DYNAMIC RANDOM-ACCESS MEMORY ARRAY

(71) Applicant: Micron Technology, Inc., Boise, ID (US)

(72) Inventors: Vladimir Machkaoutsan, Flemish Brabant (BE); Richard J. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 258 days.

(21) Appl. No.: 16/728,492

(22) Filed: Dec. 27, 2019

(65) Prior Publication Data

US 2020/0212041 A1    Jul. 2, 2020

Related U.S. Application Data

(60) Provisional application No. 62/786,985, filed on Dec. 31, 2018.

(51) Int. Cl.
| | | |
|---|---|---|
| H01L 27/108 | (2006.01) | |
| G11C 11/402 | (2006.01) | |
| G11C 11/404 | (2006.01) | |

(52) U.S. Cl.
CPC .... *H01L 27/10805* (2013.01); *G11C 11/4023* (2013.01); *G11C 11/4045* (2013.01); *H01L 27/10847* (2013.01)

(58) Field of Classification Search
CPC .............. H01L 27/108; H01L 27/10805; H01L 27/10808; H01L 27/10847; G11C 11/4023; G11C 11/4045; G11C 11/4097; G11C 5/06

USPC ......................................................... 257/296
See application file for complete search history.

(56) References Cited

U.S. PATENT DOCUMENTS

| | | | |
|---|---|---|---|
| 2011/0026232 A1* | 2/2011 | Lin | ......... H01L 24/24 361/760 |
| 2014/0097479 A1 | 4/2014 | Thomas | |
| 2016/0086957 A1 | 3/2016 | Cho et al. | |
| 2016/0365291 A1 | 12/2016 | Barth, Jr. et al. | |
| 2017/0053932 A1 | 2/2017 | Jeon | |
| 2018/0061834 A1* | 3/2018 | Derner | ................... H01L 28/60 |

(Continued)

FOREIGN PATENT DOCUMENTS

WO    2020142368    7/2020

OTHER PUBLICATIONS

"International Application Serial No. PCT US2019 068716, International Search Report dated Apr. 29, 2020", 3 pgs.

(Continued)

*Primary Examiner* — Sheng-Bai Zhu
(74) *Attorney, Agent, or Firm* — Schwegman Lundberg & Woessner, P.A.

(57) ABSTRACT

Disclosed are monolithically integrated three-dimensional (3D) DRAM array structures that include one-transistor, one-capacitor (1T1C) cells embedded at multiple device tiers of a layered substrate assembly. In some embodiments, vertical electrically conductive data-line and ground pillars extending through the substrate assembly provide the transistor source and ground voltages, and horizontal electrically conductive access lines at multiple device levels provide the transistor gate voltages. Process flows for fabricating the 3D DRAM arrays are also described.

24 Claims, 41 Drawing Sheets

(56) References Cited

U.S. PATENT DOCUMENTS

| | | | | |
|---|---|---|---|---|
| 2018/0061840 A1* | 3/2018 | Sills | .................. | H01L 27/10844 |
| 2018/0261613 A1* | 9/2018 | Ariyoshi | ............. | H01L 27/1157 |
| 2018/0301454 A1* | 10/2018 | Mathew | ................ | G11C 5/063 |
| 2019/0066762 A1* | 2/2019 | Koya | .................. | G11C 11/4076 |

OTHER PUBLICATIONS

"International Application Serial No. PCT US2019 068716, Written Opinion dated Apr. 29, 2020", 5 pgs.

\* cited by examiner

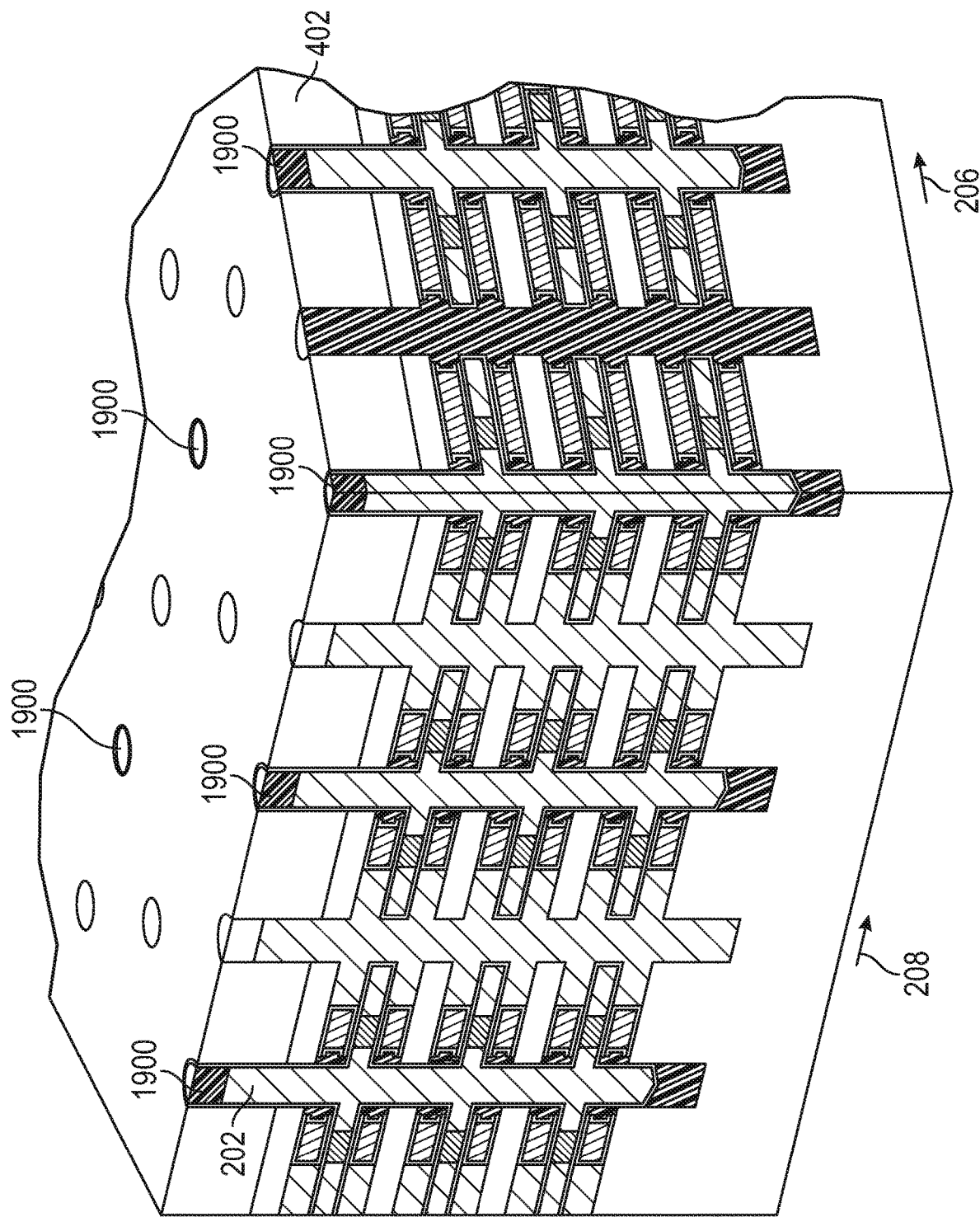

THREE-DIMENSIONAL DYNAMIC RANDOM-ACCESS MEMORY ARRAY

PRIORITY APPLICATION

This application claims the benefit of priority to U.S. Provisional Application Ser. No. 62/786,985, filed Dec. 31, 2018, which is incorporated herein by reference in its entirety.

BACKGROUND

Dynamic random-access memory (DRAM) is a type of volatile semiconductor memory that is routinely used as the main memory in modern computers and graphics cards, as well as in other electronic devices, such as portable devices and video game consoles. DRAM stores each bit of data in a capacitor within an integrated circuit; it is "dynamic" in that it uses an external memory refresh circuit to periodically rewrite the data in the capacitors, preventing data loss that would otherwise occur due to leakage of the electric charge in the capacitors. Over decades, DRAM bit densities have undergone a rapid growth, contributing to the ever-increasing memory capacity of electronic devices. However, DRAM scaling in two dimensions is expected to approach the end of the roadmap in a few generations, prompting a desire for extending DRAM structures into the third dimension.

BRIEF DESCRIPTION OF THE DRAWINGS

In the accompanying drawings, various fill patterns and hatch styles are used to provide a visual contrast between different material layers and device components. These fill patterns and hatch styles are not intended to limit the choice of material for the respective layer or device component (and may deviate from conventions regarding the depiction of various materials); instead, suitable materials are listed in the textual description.

FIGS. 4-19A illustrate a process of forming a 3D array of memory cells with double-gated transistors, according to one embodiment, with a series of cut-away perspective views showing the intermediate structures resulting from various steps of the process.

FIGS. 19B-33 illustrate a process of forming electrical connections to the 3D array of memory cells of FIGS. 4-19A with a series of cut-away perspective views showing the intermediate structures resulting from various steps of the process.

DETAILED DESCRIPTION

Figure 1:
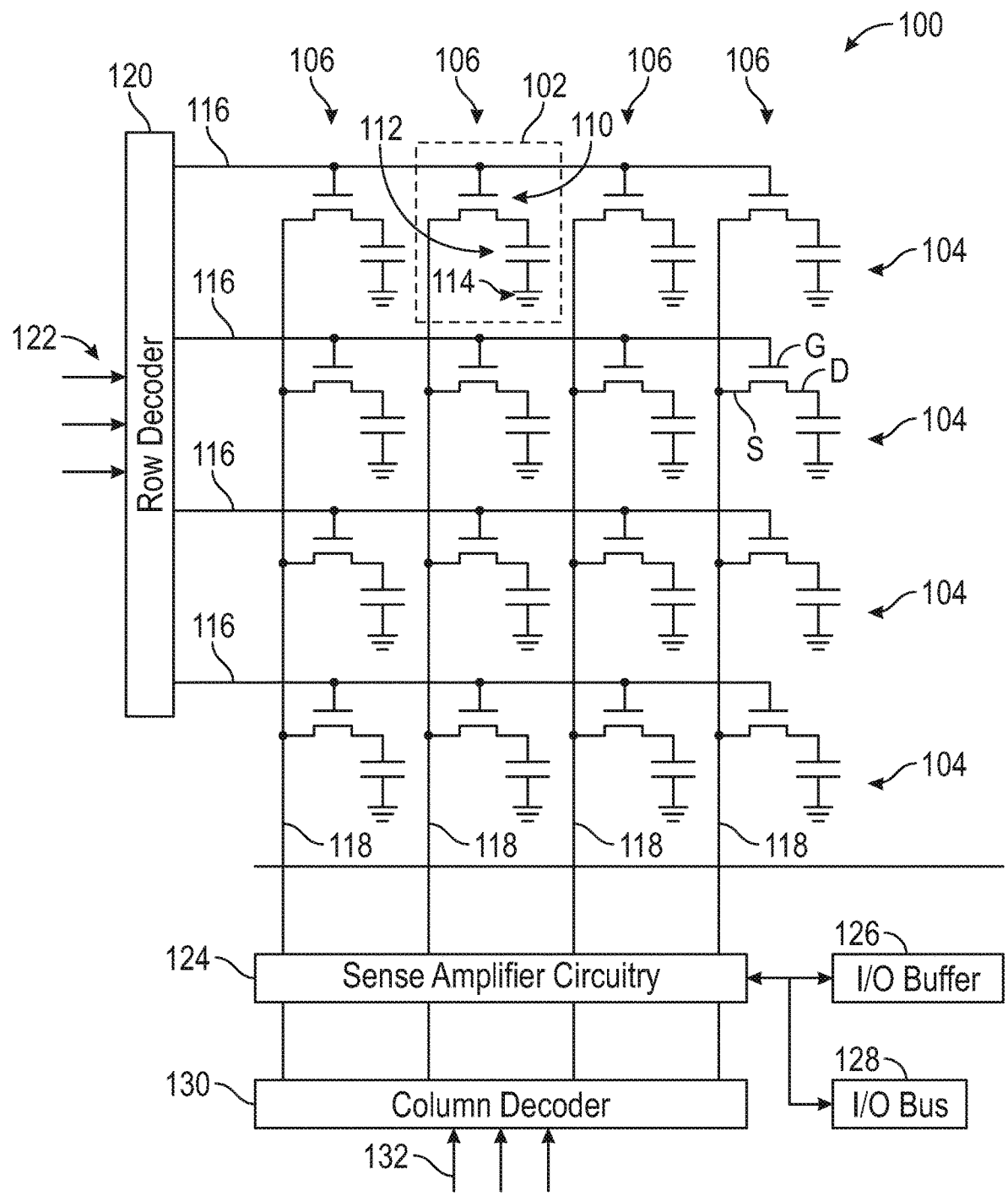
FIG. 1 is a schematic diagram of an example DRAM device according to various embodiments.

Described herein are three-dimensional (3D) DRAM array structures in a monolithic multi-layer implementation, along with process flows for creating such structures. In accordance with various embodiments, the DRAM array comprises one-transistor, one-capacitor (1T1C) cells embedded in a layered substrate assembly in a 3D lattice arrangement. (The term "substrate assembly" is used herein to identify the base level substrate itself as well as additional structures formed on or over the substrate. In many examples, the substrate will be a semiconductor substrate, such as a silicon substrate, though alternative configurations of a substrates may be used (such as, e.g., silicon on insulator, or other configurations known to persons skilled in the art) for supporting the forming of a memory structure as described herein.

The description below addresses the forming of a memory array as part of the substrate assembly, and thus the memory array will be formed over the substrate. As discussed in more detail later herein, other structures may be formed over the substrate, and beneath the memory array. As one example, peripheral circuitry for operating a memory device may be formed with devices formed in part within the semiconductor substrate and in part in one or more material levels over the substrate. Such peripheral circuitry, as is well known to persons skilled in the art and may include, for example, address decoders (row and column decoders), pre-charge circuits, sense amplifiers, and timing and control circuitry, may be used to operate the memory array, including storing data in and reading data from the memory array. In other examples, such peripheral circuitry may be formed alongside the memory array. The specific form in which such peripheral circuitry (or other structures outside the memory array) may be formed in the substrate assembly does not form a part of the presently described subject matter, and is therefore not specifically addressed in this description.

The described memory array includes multiple device tiers, each device tier including multiple arrayed memory devices, wherein connections are provided between vertically offset memory devices of multiple device tiers. In the depicted examples, the device tiers are vertically separated by dielectric separation levels. In the depicted example configurations of memory arrays, each device tier includes a dielectric device level either "sandwiched between" two electrically conductive device levels (for double-gated transistor embodiments) or adjacent a single electrically conductive device level (for single-gated transistor embodiments). The dielectric and conductive device levels may each be formed by a single layer of dielectric or conductive material, respectively; or alternatively, each level may include multiple materials that cooperatively form the characteristics of the respective level. For instance, the dielectric device levels may each include multiple dielectric materials (which in some examples will miss now, may be present in one or more layers), and/or the conductive device levels may each include multiple conductive materials present in one or more layers. Similarly, the dielectric separation levels may each be formed by a single layer of dielectric material or by multiple stacked layers of dielectric materials. For ease of discussion, the dielectric and conductive device levels, as well as the dielectric separation levels, will hereinafter be described simply as individual respective layers. It is to be understood, that the described "layers" are presented as basic representations of levels including one or more materials to form the described structures and provide the described functionality. Accordingly, unless expressly indicated otherwise, each discussion of a material layer is representative of a level formed of one or more materials.

The 3D RAM array includes, in accordance with various embodiments, vertical electrically conductive data-line and ground pillars extending through the multiple device tiers to provide the transistor source and ground voltages, and horizontal electrically conductive access lines at multiple device tiers within the multi-layer substrate assembly to provide the transistor gate voltages. The term "ground pillar" as used herein, as referencing the memory array to ground potential will be a common implementation. However, each description of a pillar at ground potential may be substituted with a pillar at a different reference potential. As used herein, the term "horizontal" means within or parallel to the plane of the substrate assembly and its layers, and the term "vertical" means generally normal/perpendicular to the plane of the substrate assembly and its layers, irrespective of the orientation of the substrate assembly.)

Compared with deck-by-deck implementations, in which two-dimensional (2D) DRAM arrays are stacked in the third dimension, the described monolithic 3D DRAM arrays with vertically disposed devices operably associated with vertical pillars, and the associated fabrication processes, allow for more cost-effective increases in bit density. In addition, the disclosed 3D DRAM arrays allow placing peripheral circuitry underneath the array, further reducing the overall device size.

The foregoing broad overview will be more readily understood from the following detailed description of various example embodiments, in particular, when taken in conjunction with the accompanying drawings.

FIG. 1 provides a schematic of an example DRAM device 100 according to various embodiments. The device includes an array of memory cells 102 (only one being labeled in FIG. 1 to avoid obfuscation) arranged in rows 104 and columns 106. For simplicity, and sufficiently for purposes of explaining fundamental components and the basic operation of the memory device 100, the array is shown in only two dimensions; the discussion following FIG. 1 will address how the array can be extended into the third dimension in accordance with the disclosed subject matter. Further, while only four rows 104 and columns 106 are illustrated, it is to be understood that DRAM devices can, in practice, include many more (e.g., tens, hundreds, or thousands of) memory cells 102 per row and/or per column.

In accordance with various embodiments, each memory cell 102 includes a single transistor 110 (e.g., a field effect transistor (FET)) and a single capacitor 112; such a cell is, therefore, also commonly referred to as a 1T1C cell. One plate of the capacitor 112, herein also the "node plate," is connected to the drain terminal ("D") of the transistor 110, whereas the other plate of the capacitor 112 is connected to ground 114. Each capacitor 112 within the array of 1T1C cells 102 serves to store one bit of data, and the respective transistor 110 serves as an "access device" to write to or read from the storage capacitor 112.

The transistor gate terminal terminals ("G") within each row 104 are portions of respective access lines (alternatively referred to as "word lines") 116 (and may be formed of the same material, or a different material), and the transistor source terminals ("S") within each column 106 are electrically connected to respective data lines (alternatively referred to as "bit lines") 118. A row decoder 120 can selectively drive the individual access lines 116, responsive to row address signals 122 input to the row decoder 120. Driving a given access line 116 at a high voltage causes the access transistors 110 within the respective row 104 to conduct, thereby connecting the storage capacitors 112 within the row 104 to the respective data lines 118, such that charge can be transferred between the data lines 118 and the storage capacitors 112 as required for read or write operations. Both read and write operations can be performed via sense amplifier circuitry 124, which can transfer bit values between the memory cells 102 of the selected row 104 and input/output buffers 126 (for write/read operations) or external input/output data buses 128. A column decoder 130 responsive to column address signals 132 can select which of the memory cells 102 within the selected row 104 is read out or written to. Alternatively, for read operations, the storage capacitors 112 within the row 104 may be read out simultaneously and latched, and the column decoder 130 can then select which latch bits to connect to the output data bus 128. Since read-out of the storage capacitors destroys the stored information, the read operation is accompanied by a simultaneous rewrite of the capacitor charge. Further, in between read/write operations, the capacitor charge is repeatedly refreshed to prevent data loss. Details of read/rewrite, write, and refresh operations are well-known to those of ordinary skill in the art.

The memory device 100 may be implemented as an integrated circuit within a package that includes pins for receiving supply voltages (e.g., to provide the source and gate voltages for the transistors 110) and signals (including data, address, and control signals). In general, it is to be understood that FIG. 1 depicts memory device 100 in drastically simplified form to illustrate basic structural components and principles of operation, omitting many details of the memory cells 102 and associated access and data lines 116, 118 as well as the peripheral circuitry. For example, in addition to the row and column decoders 120, 130, sense amplifier circuitry 124, and buffers 126, the memory device 100 may include further peripheral circuitry, such as a memory control unit that controls the memory operations based on control signals (provided, e.g., by an external processor), additional input/output circuitry, etc. Details of such peripheral circuitry are generally known to those of ordinary skill in the art and not further discussed herein. Instead, the following description focuses on structural details of the memory cells 102 and layout of the memory cell array in accordance with various embodiments.

In conventional 2D DRAM arrays, the rows 104 and columns 106 of memory cells 102 are arranged along a single horizontal plane (i.e., a plane parallel to the layers) of the semiconductor substrate, e.g., in a rectangular lattice with mutually perpendicular horizontal access and data lines 116, 118. By contrast, in 3D DRAM arrays as described herein, the memory cells 102 are arranged in a 3D lattice that encompasses multiple vertically stacked horizontal planes corresponding to multiple device tiers of a multi-tier substrate assembly, with each device tier including multiple parallel rows of cells 102 whose transistor gate terminals are connected by horizontal access lines 116. (A "device tier," as used herein, may include multiple layers (or levels) of materials, but forms the components of memory devices of a single horizontal tier of memory cells.) The data lines 118 extend vertically through all or at least a vertical portion of the multi-tier structure, and each data line 118 connects to the transistor source terminals of a vertical column 106 of associated memory cells 102 at the multiple device tiers. Beneficially, this 3D configuration of memory cells enables further increases in bit density compared with 2D arrays. In addition, the disclosed 3D DRAM devices allow placing peripheral circuitry underneath the array memory cells, further reducing the overall device size.

Figure 2:
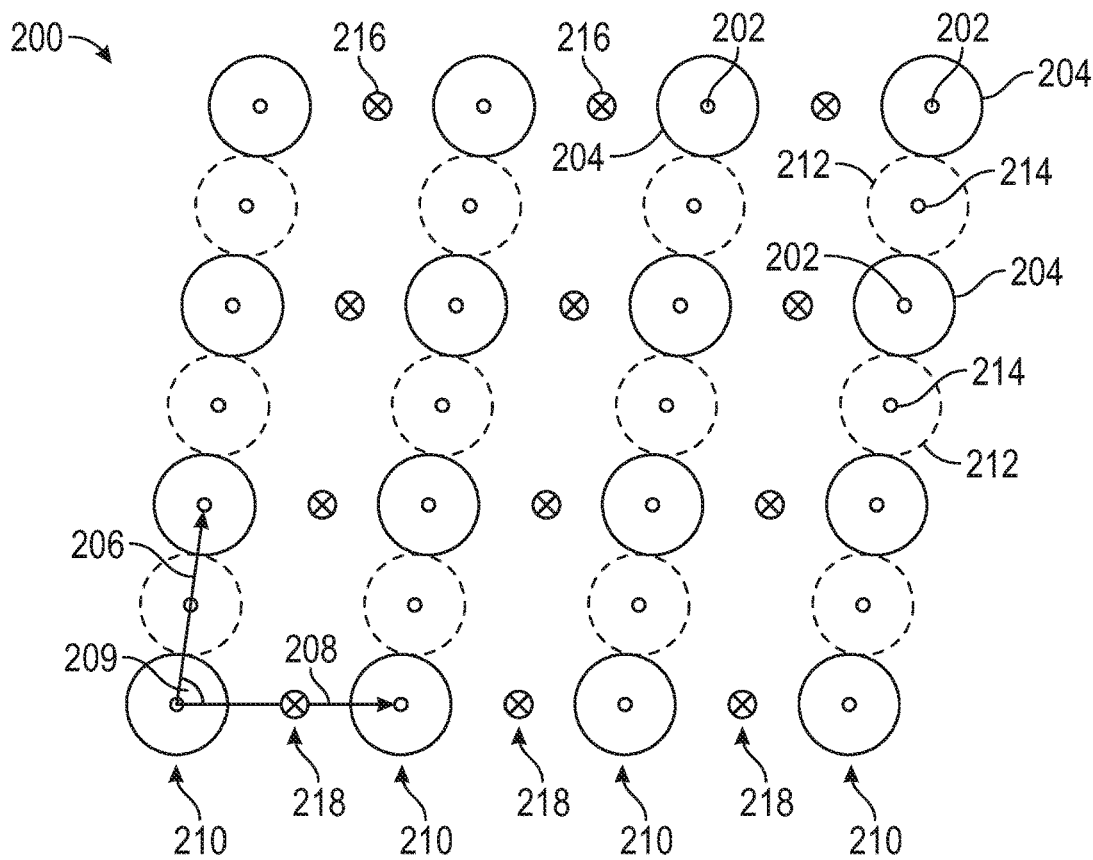
FIG. 2 is a schematic top view of a 3D RAM array in accordance with various embodiments.

FIG. 2 is a schematic top view of a 3D DRAM array 200 in accordance with various embodiments, illustrating an example arrangement of the vertical data-line pillars 202 (implementing the data lines 118) and associated memory cells 204 (corresponding to cells 102). (Only some of the pillars 202 and cells 204 are labeled for clarity.) As shown, the data-line pillars 202 may be arranged at the vertices of a parallelogrammic lattice spanned by lattice vectors 206, 208 defining first and second horizontal directions, respectively. The lattice vectors 206, 208 (and corresponding horizontal directions) may include an acute angle 209 (as shown, measuring the angle between vector 206 and vector 208 in the mathematically negative (clockwise) direction) or a right angle (the latter resulting in the special case of a rectangular lattice). The memory cells 204 may be formed at least partially surrounding the data-line pillars 202, as explained in more detail below with respect to FIG. 3. Within rows 210 of memory cells 204 extending along the first horizontal direction (defined by lattice vector 206), the transistor gates of the memory cells 204 are electrically coupled to each other to form horizontal access lines. In some embodiments, the electrical connections between adjacent memory cells 204 are facilitated by conductive rings 212, e.g., structurally similar to the transistor gates, surrounding vertical "dummy pillars" 214 placed along the rows 210 mid-way between any adjacent pair of data-line pillars 202. The 3D RAM array 200 also includes "reference pillars" coupled to a reference voltage to which one plate of the storage capacitors will be coupled; in many examples, the reference voltage will be ground potential, and the reference pillars are therefore herein also referred to as "ground pillars" 216. The ground pillars 216 are arranged along a second set of rows 218 extending in the first direction that are placed between adjacent rows 210 of data-line pillars, such that data-line pillars 202 and ground pillars 216 alternate in the second horizontal direction. The data-line pillars 202 may be individually addressable (using a column address decoder as described above), allowing any one of the memory cells at a selected device tier to be accessed. The horizontal access lines may likewise be individually addressable, or may be grouped by device tier to select all rows of a given device tier simultaneously.

Figure 3:
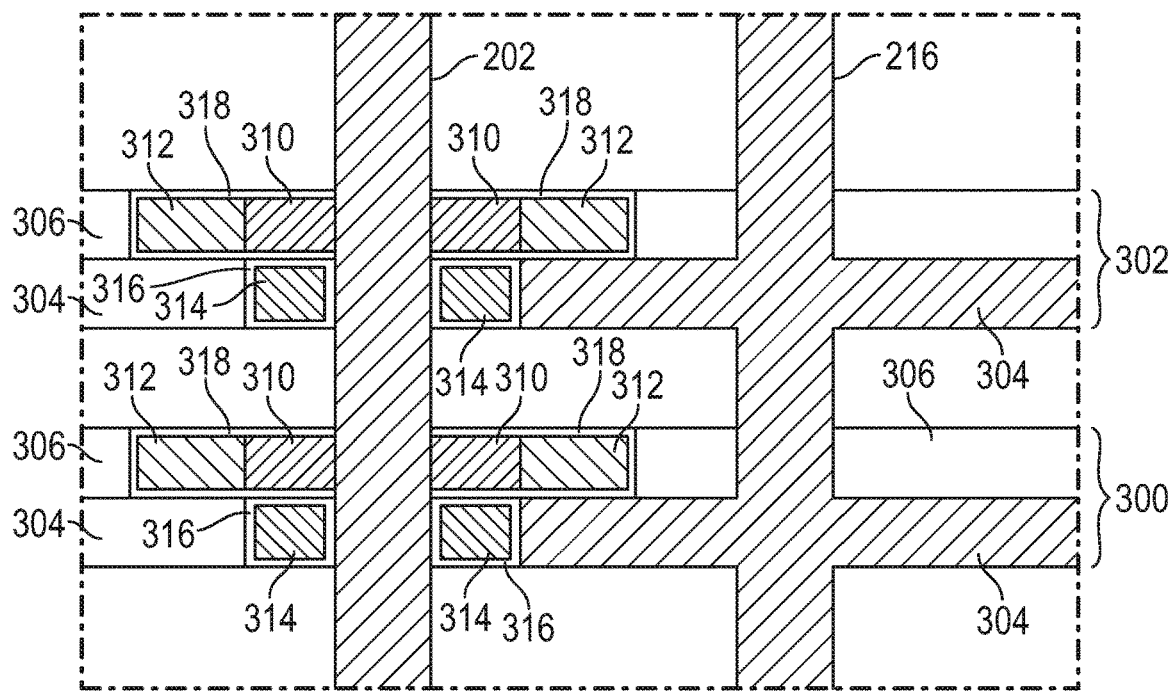
FIG. 3 is a schematic cross-sectional view of a 3D DRAM array in accordance with various embodiments.

FIG. 3 is a schematic cross-sectional view of the 3D DRAM array 200 in accordance with various embodiments, showing a cut, parallel to the vertical and second horizontal directions, through one of the data-line pillars 202 and one of the neighboring ground pillars 216. The figure illustrates two device tiers 300, 302 (of generally two or more device tiers), each including an electrically conductive device layer 304 and an electrically insulating dielectric device layer 306. The dielectric device layer 306 may be placed above (as shown) or below the conductive device layer 304, or, alternatively, the insulating dielectric device layer 306 may be sandwiched between two conductive device layers 304. The ground pillar 216 is in electrical contact with (and, indeed, may be made from the same material and form and integral structure with) the conductive device layers 304. The data-line pillar 202, on the other hand, is electrically insulated from the conductive device layers 304.

In each of the dielectric device layers 306, each data-line pillar 202 is at least partially surrounded by a transistor channel 310 made from a semiconductor material (e.g., a wide-bandgap material such as undoped polysilicon) and forming, e.g., an inner ring around the data-line pillar 202. Each transistor channel 310, in turn, is at least partially surrounded by a capacitor node plate 312 made from an electrically conductive material and forming, e.g., an outer ring around the transistor channel 310. In each of the conductive device layers 304, each data-line pillar 202 is at least partially surrounded by an electrically conductive transistor gate 314 made from an electrically conductive material and forming, e.g., a ring around the data-line pillar 202.

The transistor channel 310, capacitor node plates 312, and transistor gates 314 are all examples of structures herein described as being a "ring" extending around or "surrounding" another structure (e.g., a data-line pillar 202). In some examples, such a "ring" can be a continuous annular structure extending a full 360° around the surrounded pillar; in other examples, the ring can be discontinuous structure extending around only a portion of the surrounded pillar; and in still other examples, the ring may be a discontinuous structure include multiple portions that collectively extend around at least a portion of the surrounded pillar. For purposes of the present description, all of these configurations are termed "ring" structures. Additionally, such "ring" structures may conveniently be formed with vertical surfaces defining interior and/or exterior surfaces defining a circle, when viewed from a horizontal plane; however, the described ring structures are not limited to being defined by such circular surfaces, and other shapes may be defined by the interior and/or exterior surfaces of a "ring," as described and discussed herein.

The transistor gate 314 overlaps horizontally with, but is electrically insulated from, the transistor channel 310 thereabove (and/or therebelow, depending on where the conductive layer is located relative to the dielectric layer), and is electrically insulated from the surrounding conductive device layer 304 as well as the respective data-line pillar 202, e.g., by one or more dielectric layers 316, which may have a thickness, for example, between 1 nm and 50 nm. The transistor of a memory cell in accordance herewith is, thus, formed by the transistor channel 310 in conjunction with the transistor gate 314, with the data-line pillar 202 and capacitor node plate 312 serving as source and drain terminals, respectively. The capacitor node plate 312 horizontally overlaps with the conductive device layer 304 therebelow (and/or thereabove), but is electrically insulated from the conductive device layer 304 and, thus, from the ground pillar 216, e.g., by one or more dielectric layers 318, which may likewise have a thickness between 1 nm and 50 nm. Collectively, the capacitor node plate 312, overlapping portion of the adjacent conductive device layer 304, and insulation therebetween form the storage capacitor of a memory cell.

FIGS. 4-19A illustrate a process of forming a 3D array of memory cells according to one embodiment with a series of cut-away perspective views showing the intermediate structures resulting from various steps of the process.

Figure 4:
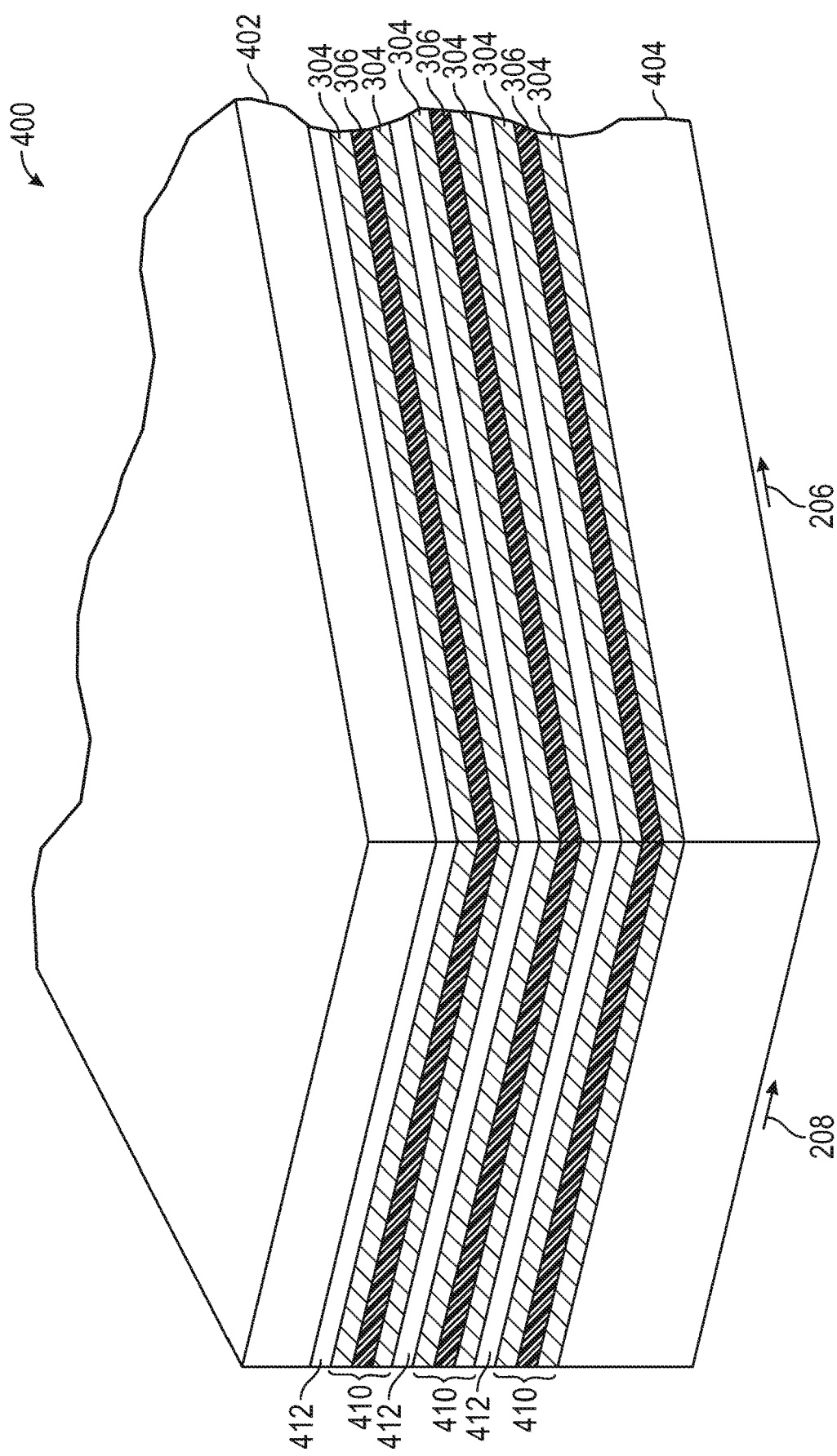

FIG. 4 shows a layered substrate assembly 400 formed over a semiconductor substrate 404 (which may have multiple material levels formed thereon that are not pertinent to the described memory array structure, and thus are not separately depicted). In the depicted example, semiconductor substrate 404 includes a dielectric region that extends around the lowermost structures described in reference to the identified figures (such as, e.g., the bottom portions of the pillars 202, 214, 216). Substrate assembly 400 also includes a top dielectric level 402, formed over a periodic stack of various material levels, as can be made using standard layer-deposition techniques (such as, e.g., chemical vapor deposition, electrochemical deposition, molecular beam epitaxy, sputtering, etc.). Each period of the stack forms a device tier. In the examples of FIGS. 4-19A, each device tier includes a dielectric device layer 306 sandwiched between two electrically conductive device layers 304, collectively forming a three-layer device tier 410; and a separate dielectric level 412 disposed on top of the upper conductive device layer 304 to separate vertically adjacent device tiers 410. As discussed relative to FIG. 3, in other examples, a device tier may include only two layers/levels (e.g., a dielectric device layer 306 and a single conductive device layer 304). While FIG. 4 shows three device tiers 410, 3D memory arrays in accordance herewith can be fabricated with many more device tiers 410, e.g., a few tens of device tiers 410. In some embodiments, the dielectric top and bottom layers 402, 404 are made of an oxide, such as, e.g., silicon dioxide ($SiO_2$). The electrically conductive device layers 304 may be made, e.g., of doped polysilicon; other material options include, e.g., doped silicon germanium (Site), conductive metal oxide, and metals and metal nitrides. The dielectric device layers 306 may include oxycarbide (SiOC), and the dielectric layers 412 separating the device tiers 410 (herein also "dielectric separation layers/ levels") may include silicon nitride (SiN); however, other dielectric materials are may be used. The dielectric device layers 306 and the dielectric separation layers 412 are generally made from different materials that provide a high etch ratio with respect to one or more etchants to enable preferentially etching only one of the layers while exposing both to the etchant.

Figure 5:
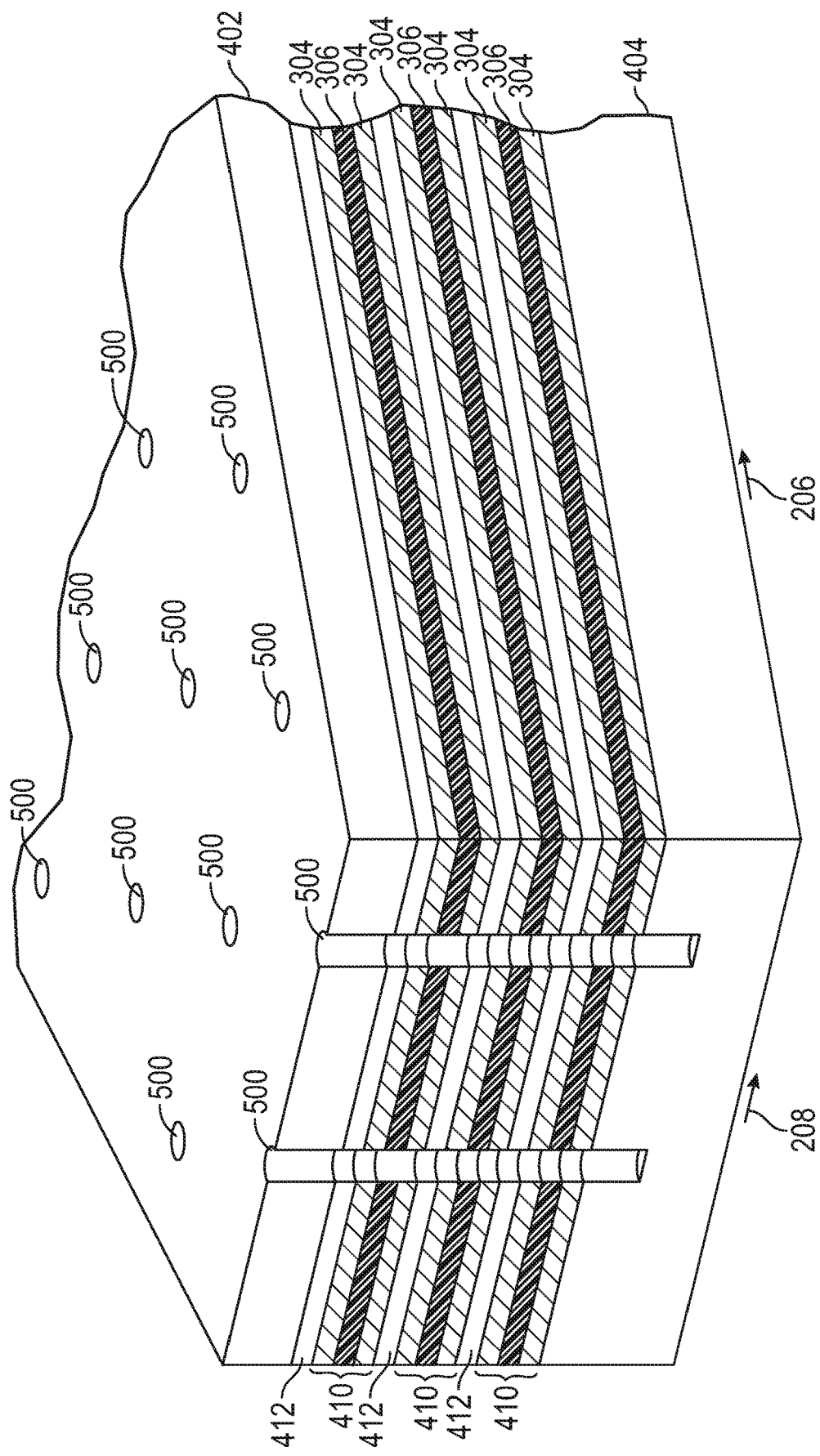

FIG. 5 shows the structure after pillar trenches 500 for the ground pillars 216 (herein also "ground pillar trenches 500") have been patterned (e.g., photolithographically) in a regular lattice arrangement and etched into the substrate assembly 400 and through the stack of device tiers 410.

Figure 6:
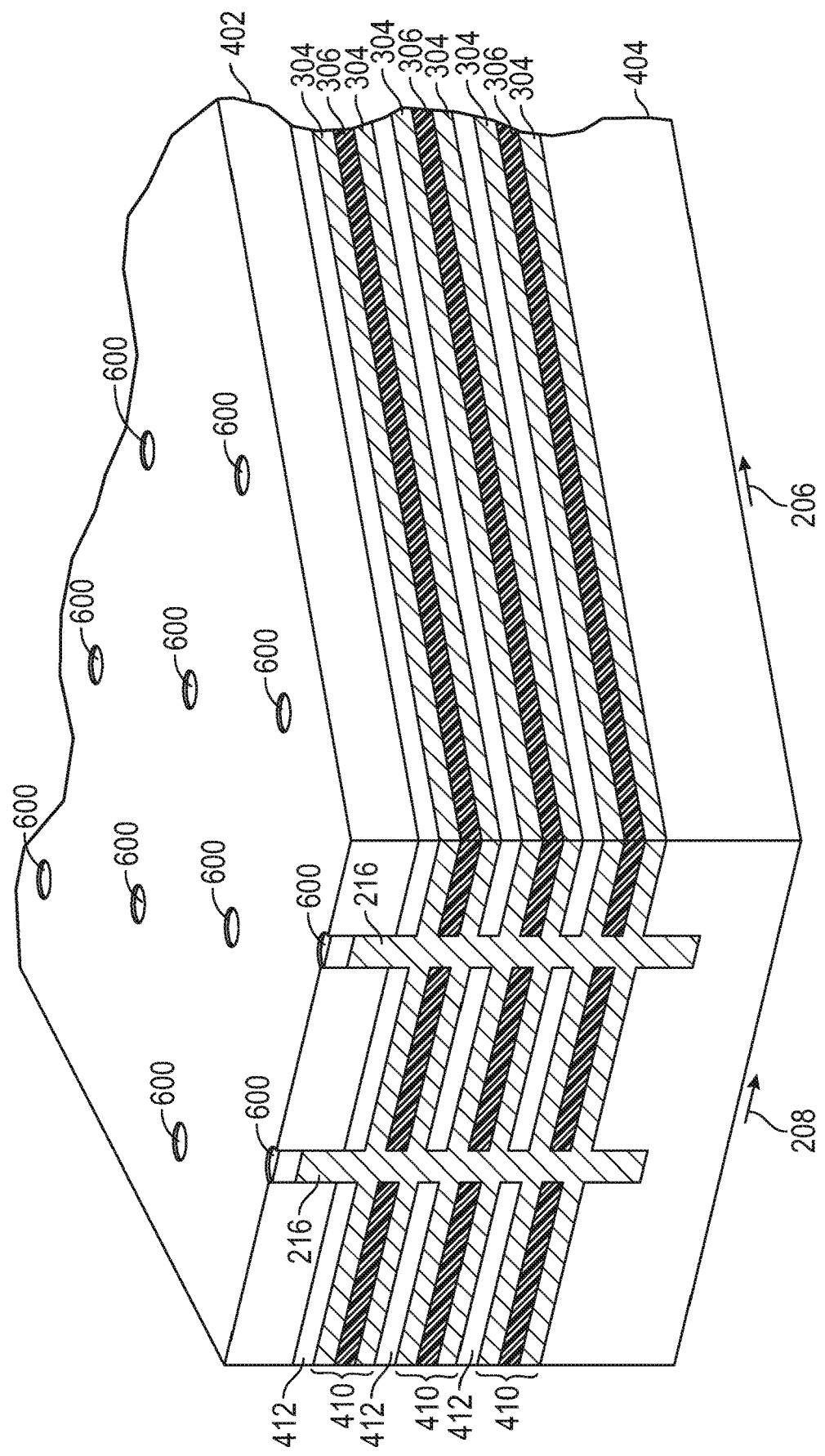

In FIG. 6, the ground pillar trenches 500 have been filled with polysilicon or some other electrically conductive material (usually, but not necessarily, the same material as used for the electrically conductive device layers 304) to form the rows 218 of ground pillars 216. The ground pillars 216 may be closed with a cap of dielectric material 600, e.g., an SiN cap.

Figure 7:
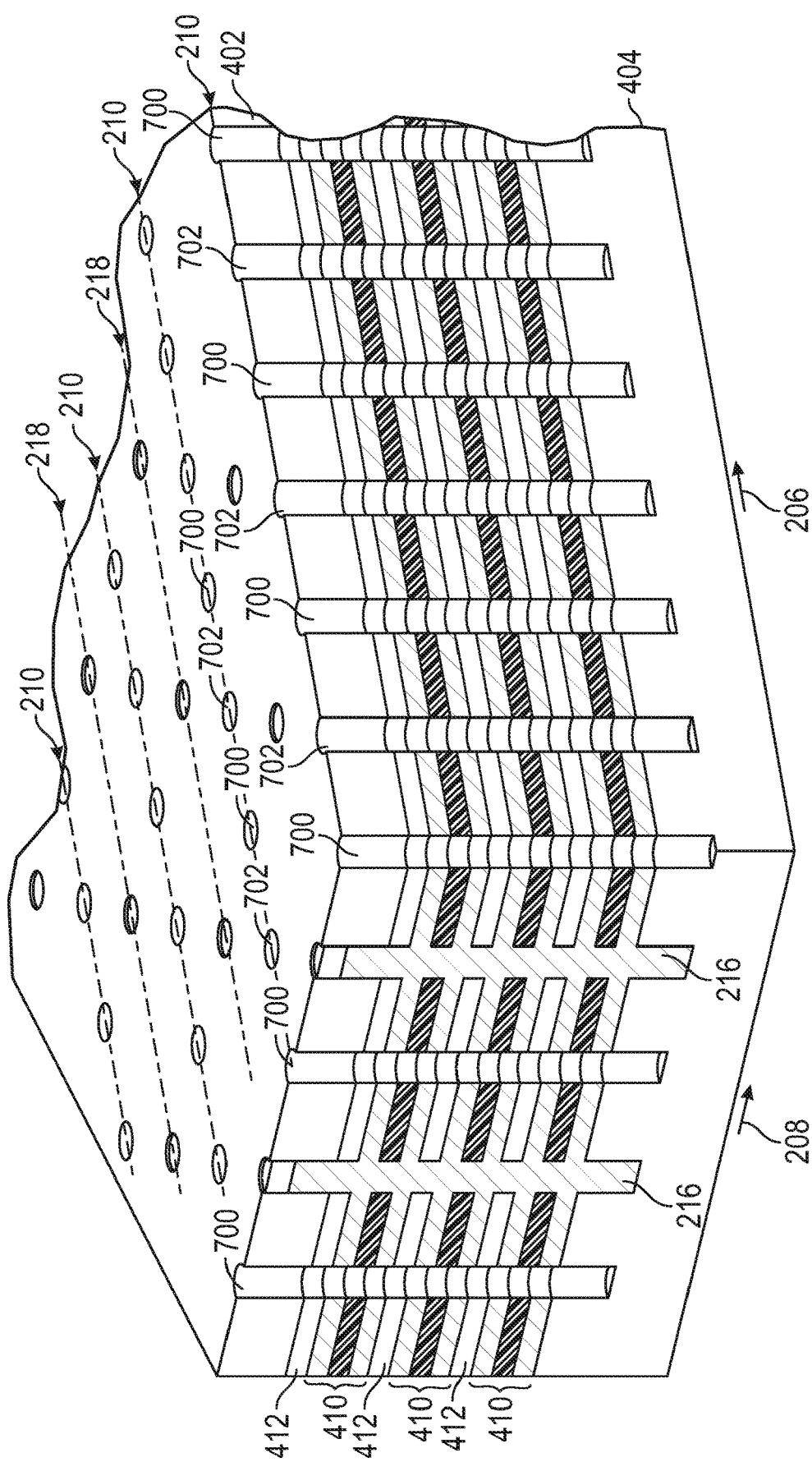

Next, as shown in FIG. 7, additional pillar trenches 700, 702 have been formed for the data-line pillars 202 and the dummy pillars 214; hereinafter, these pillar trenches are also referred to as "data-line pillar trenches 700 and dummy pillar trenches 702. (Structurally, the data-line pillar trenches 700 and dummy pillar trenches 702 are indistinguishable at this stage.) The data-line pillar trenches 700 and dummy pillar trenches 702 are arranged in rows 210 about mid-way between the rows 218 of ground pillars 216, and are spaced twice as dense (i.e., at twice the spatial frequency) as the ground pillars 216 along their respective rows 210, 218 (i.e., in the first horizontal direction 206).

Figure 8:
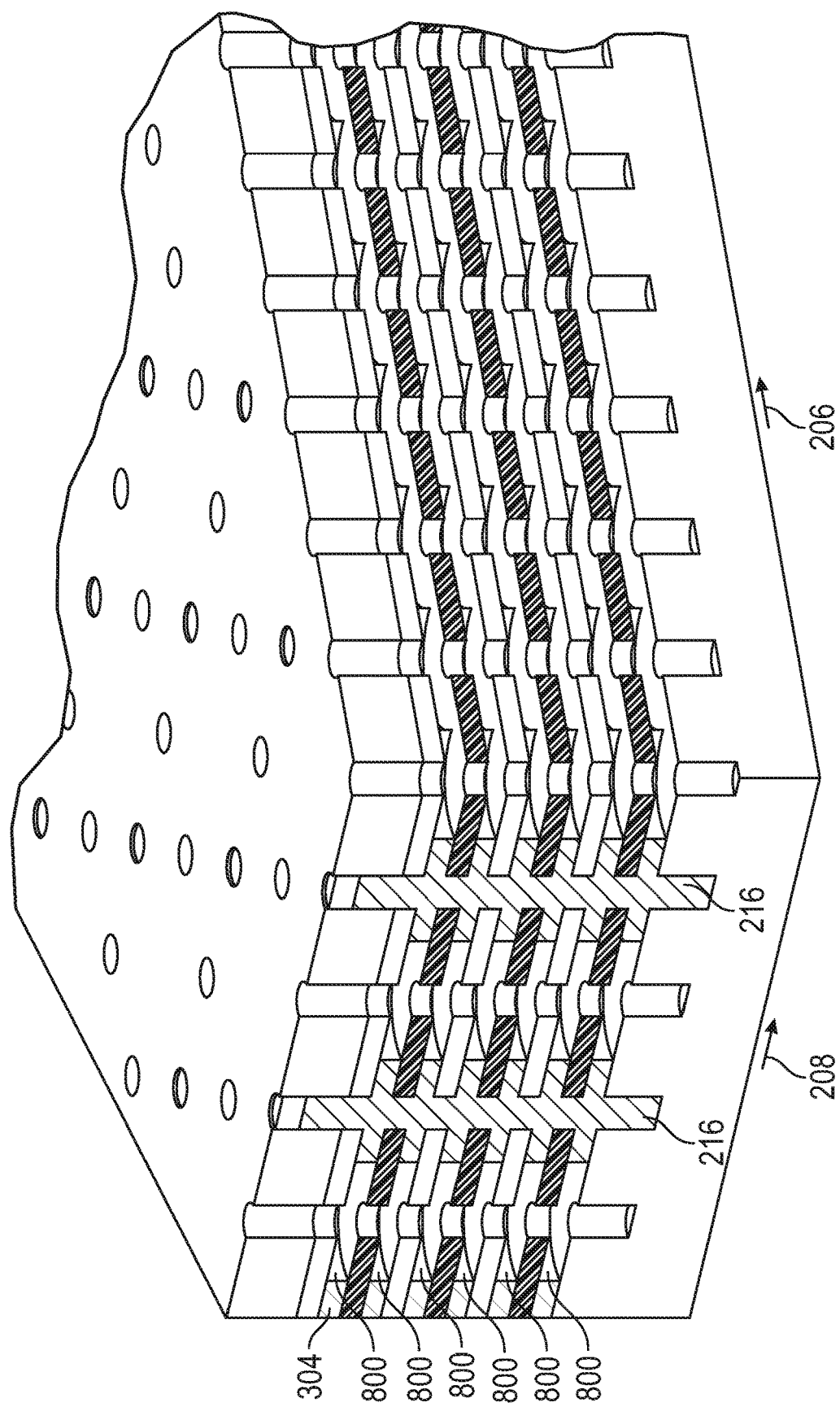

FIG. 8 shows the structure resulting from etching back the electrically conductive device layers 304 around the data-line and dummy pillar trenches 700, 702. In this manner, ring-shaped cavities 800 (labeled only for the left-most data-line pillar trench 700) are formed. For this step, an etchant that etches the electrically conductive device layers 304, but does not significantly etch the various dielectric layers 306, 412, 402, is used. For doped polysilicon device layers 304, suitable etchants include various dry chemistries, e.g., based on $Cl_2$, $CF_4$, $SF_6$, or combinations thereof, as well as wet chemistries such as TAMH. The cavities 800 provide a space in which the transistor gates 314 can be formed subsequently.

Figure 9:
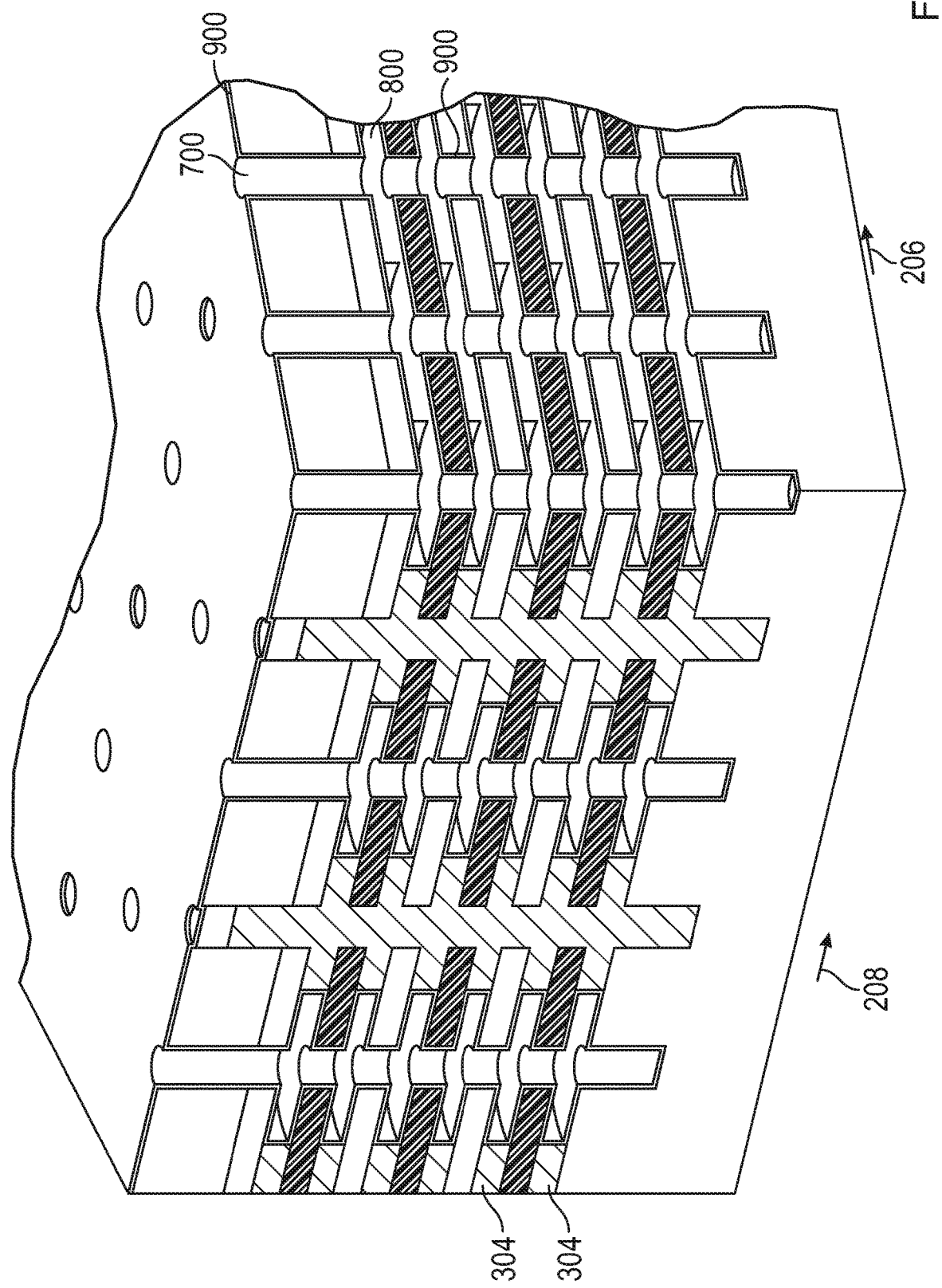

FIG. 9 shows the structure following the formation of a thin layer 900 of a high-K (also "HiK") material (i.e., a material having a higher dielectric constant than that of with $SiO_2$, i.e., above 3.6) covering the top surface of the substrate assembly 400 as well as lining the interior surface of the data-line and dummy pillar trenches 700, 702 and the surrounding ring-shaped cavities 800. This thin layer may be formed by an atomic layer deposition (ALD) process.

Figure 10:
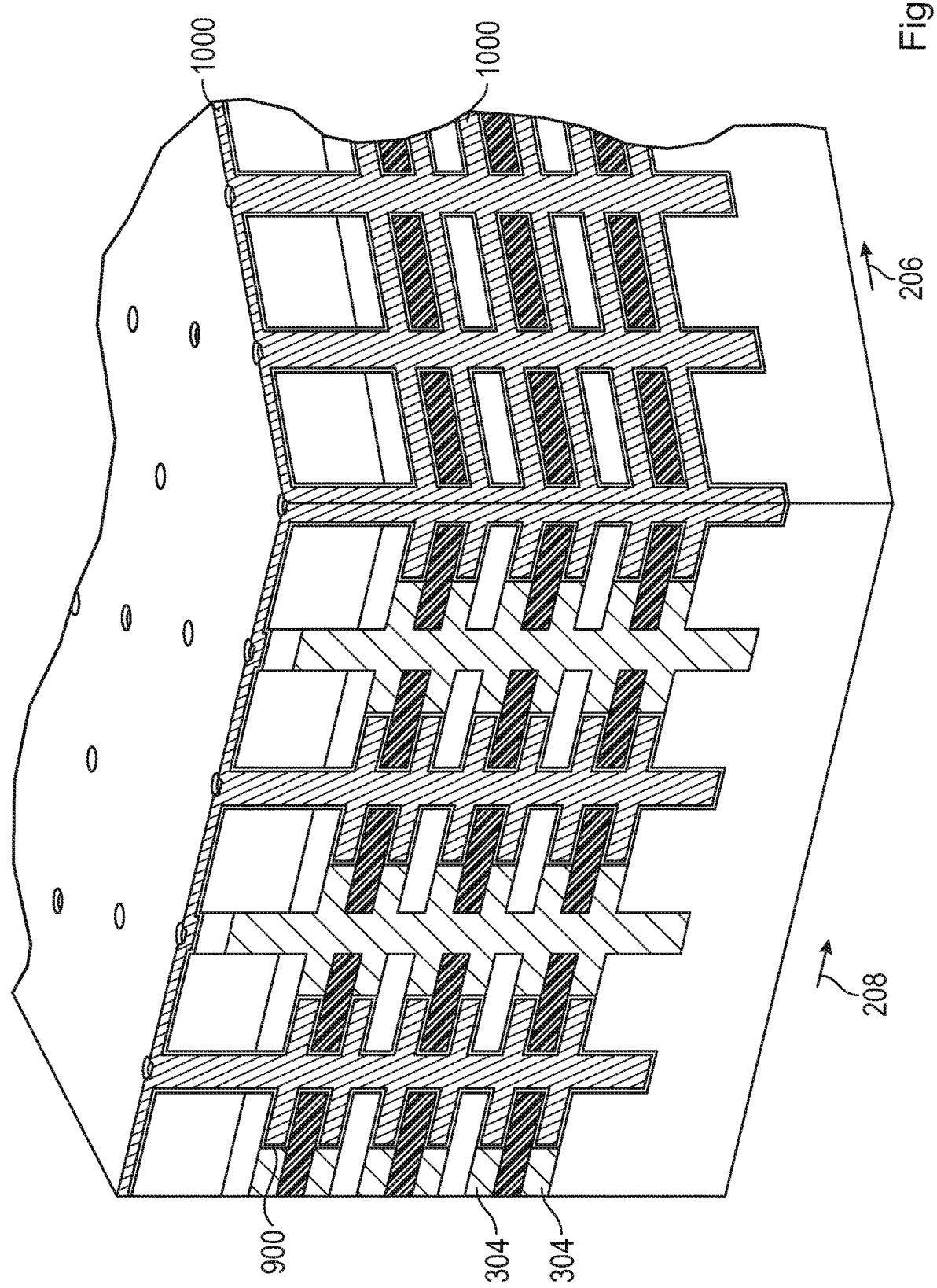

In FIG. 10, an electrically conductive material 1000, such as, e.g., a titanium nitride/tungsten (TiN/W) composition, has been deposited over the substrate assembly and to fill the HiK-lined data-line and dummy pillar trenches 700, 702 and cavities 800. This material 1000 will form the access lines of the 3D RAM array.

Figure 11:
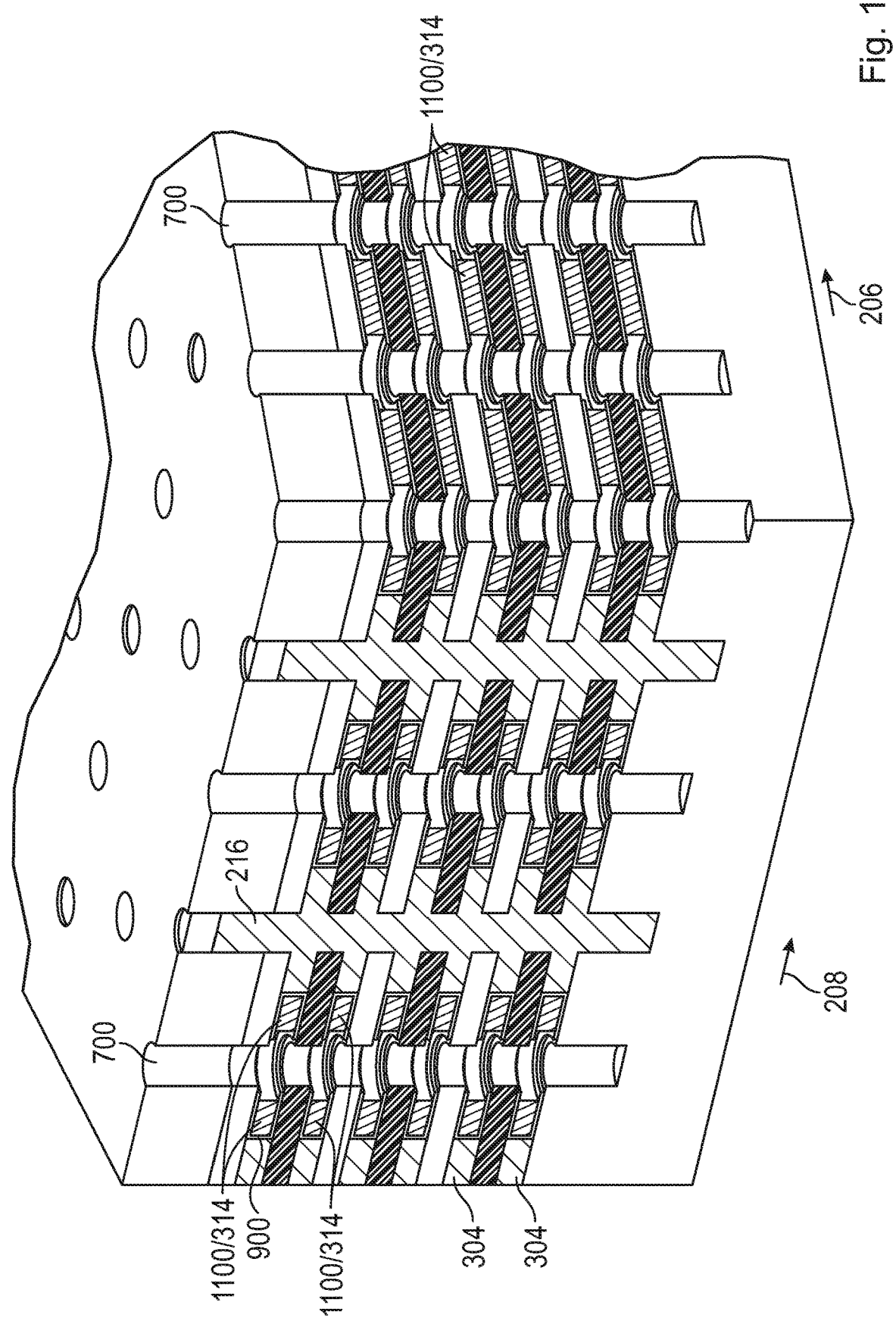

FIG. 11 shows the structure after the access-line material 1000 has been partially etched back to re-open the data-line trenches 700 and dummy pillar trenches 702. Only rings 1100 of the conductive access-line material 1000 remain embedded in the electrically conductive device layers 304 (but insulated therefrom by the HiK material 900) surrounding the pillar trenches 700, 702. These rings 1100 are electrically insulated from the surrounding device-layer material and, thus, from the ground pillars 216. The rings 1100 surrounding the data-line pillar trenches (not those surrounding the dummy pillar trenches) will form the transistor gates 314 of the memory cells.

Figure 12:
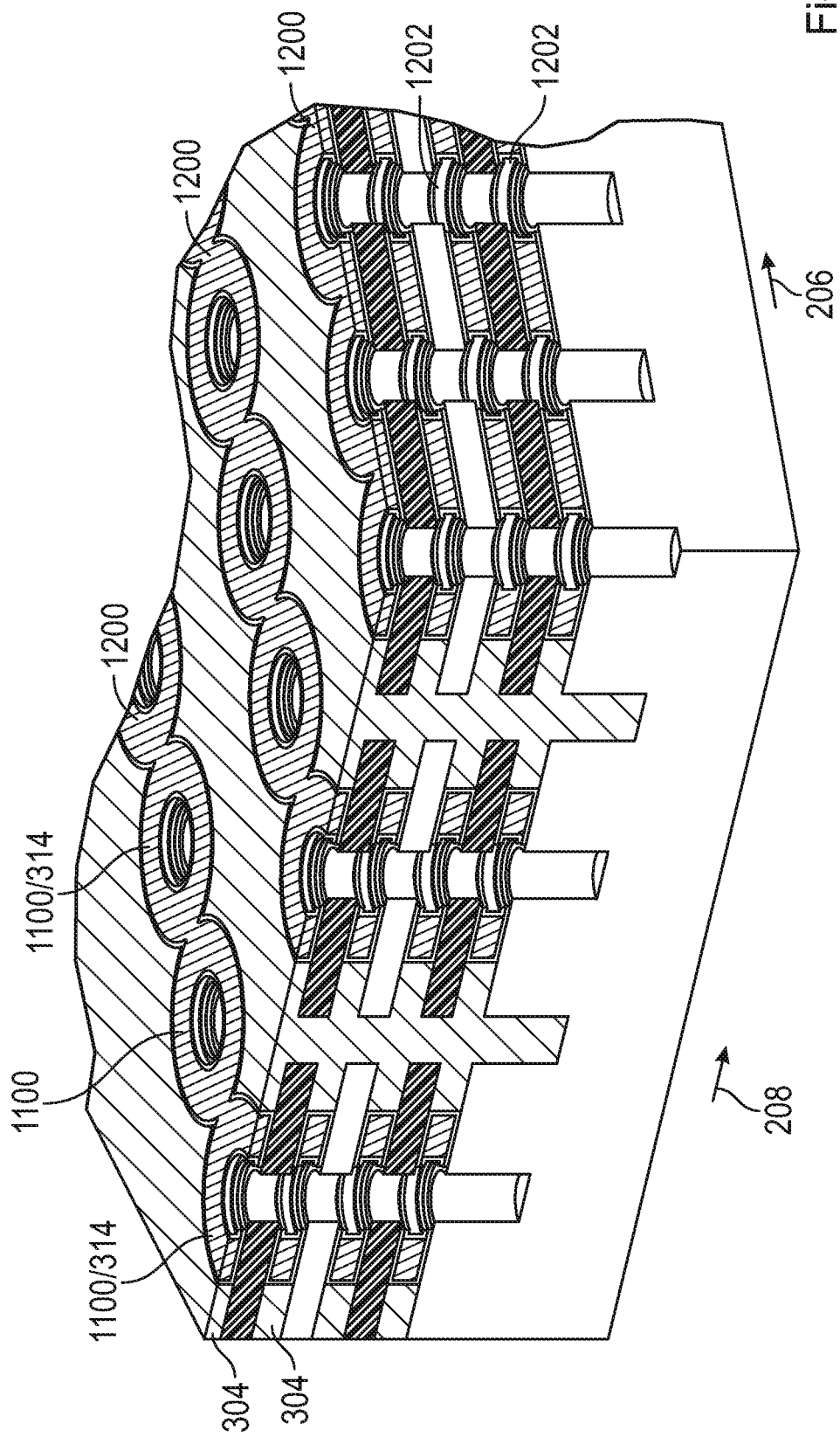

FIG. 12 further illustrates the structure of FIG. 11 with a horizontal cut taken through one of the electrically conductive device layers 304. As can be seen in this cut-away view, the rings 1100 of access-line material are sized and spaced to electrically connect with their respective neighbors in the first horizontal direction (which is indicated by vector 206), forming integral electrically conductive structures 1200— the access lines—extending along the first horizontal direction. Within each access line 1200, every other ring 1100 will form a transistor gate 314; the rings 1100 in between, which surround what will be the dummy pillars 214, serve merely to electrically couple transistor gates 314 within the access line 1200. In FIG. 12, the inner surfaces of the rings 1100 forming the access lines 1200 have been sealed off with a thin ring 1202 of electrically insulating material, such as, e.g., SiN.

Figure 13:
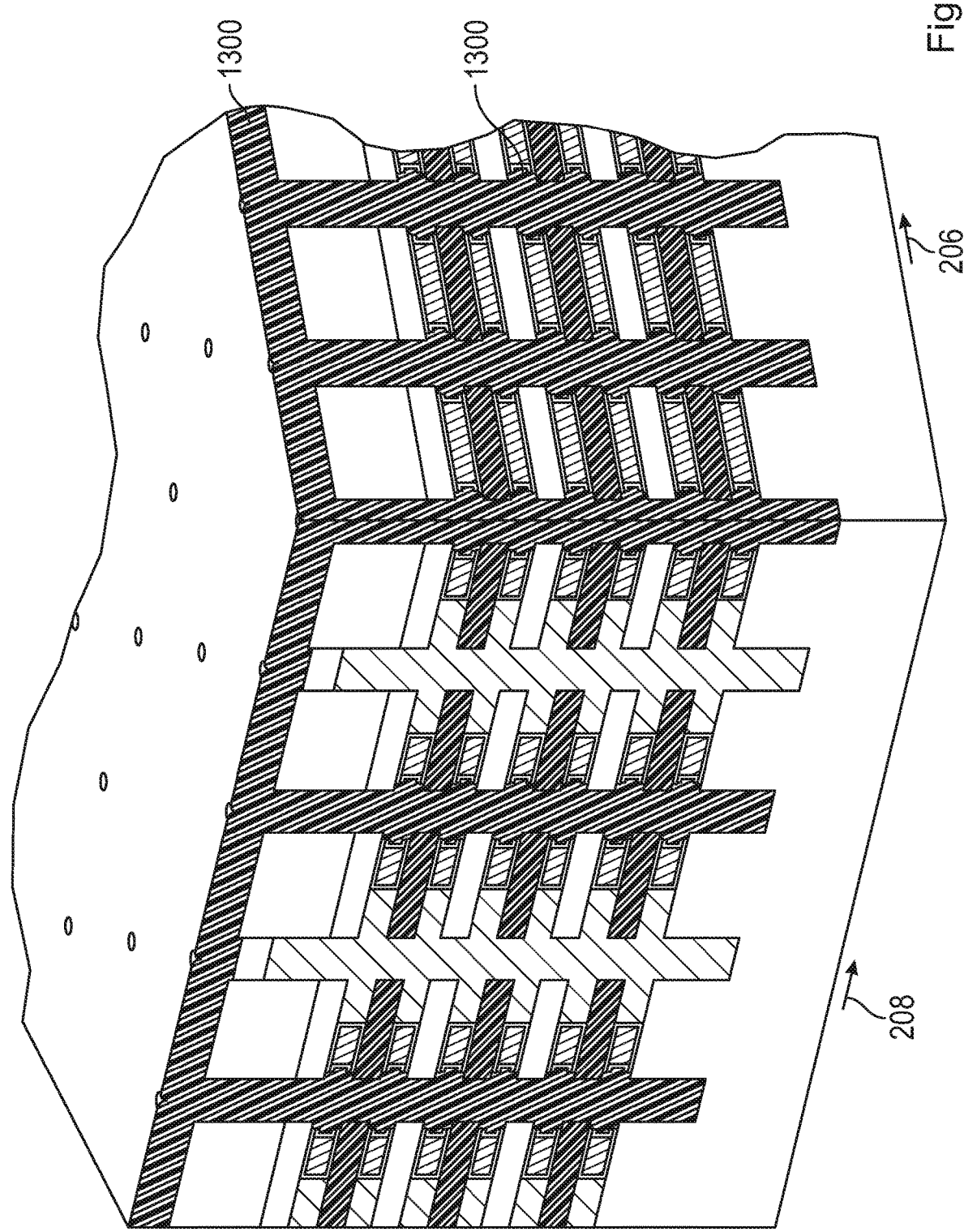

FIG. 13 shows the structure of FIG. 11, following deposition of a dielectric trench filler 1300 that closes all trenches 700, 702 and forms a dielectric layer on top of the substrate. The trench filler 1300 may, e.g., by aluminum nitride (AlN). (The small circles depicted on the top surface indicate the locations of the underlying pillars for clarity.)

Figure 14:
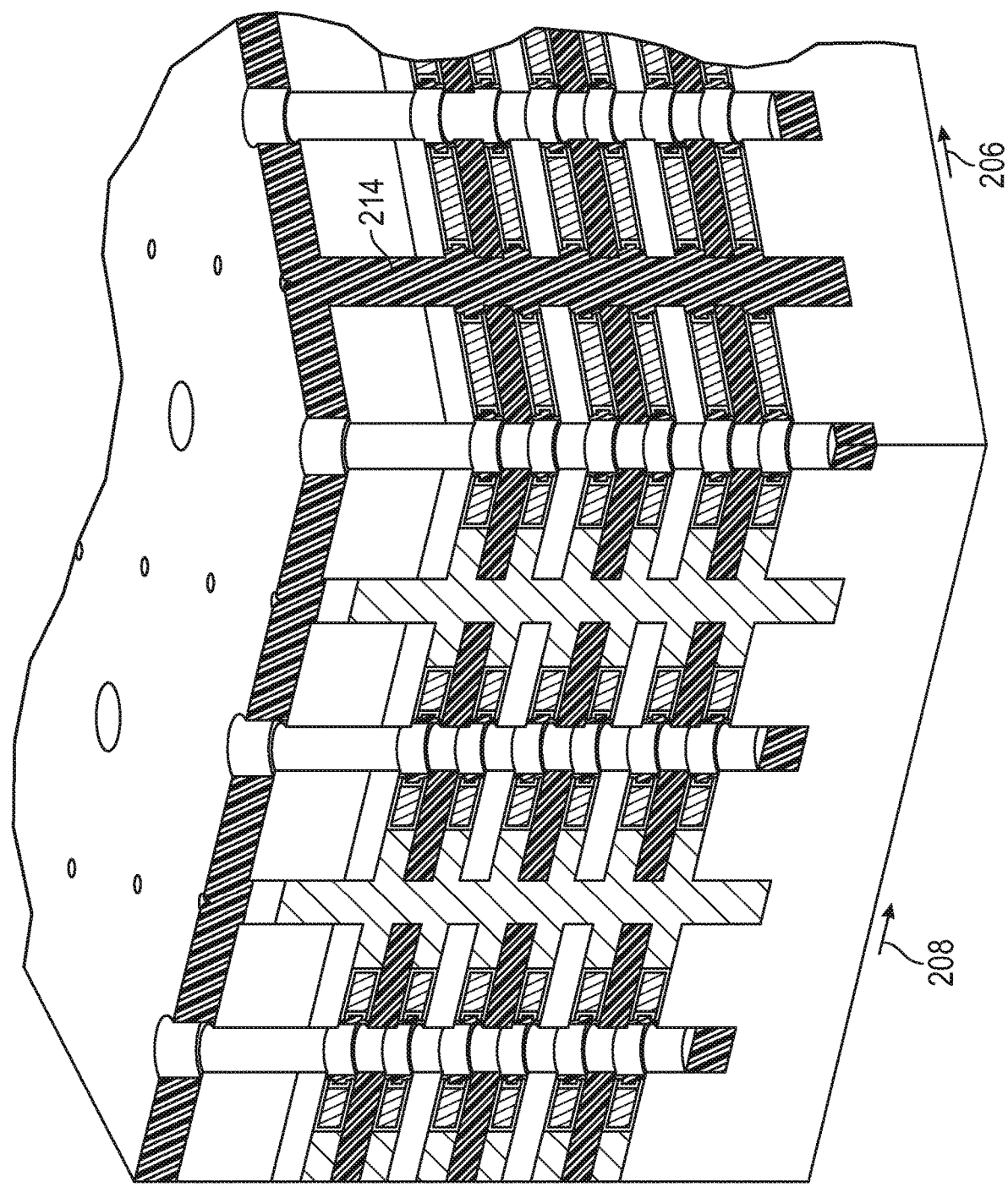

In FIG. 14, the data-line pillar trenches 700 have been opened back up (e.g., by photolithographic patterning and etching), whereas the dummy pillar trenches 702 remain sealed, forming dummy pillars 214 (arranged alternatingly, in the first horizontal direction, with what will be the data-line pillars 216).

Figure 15:
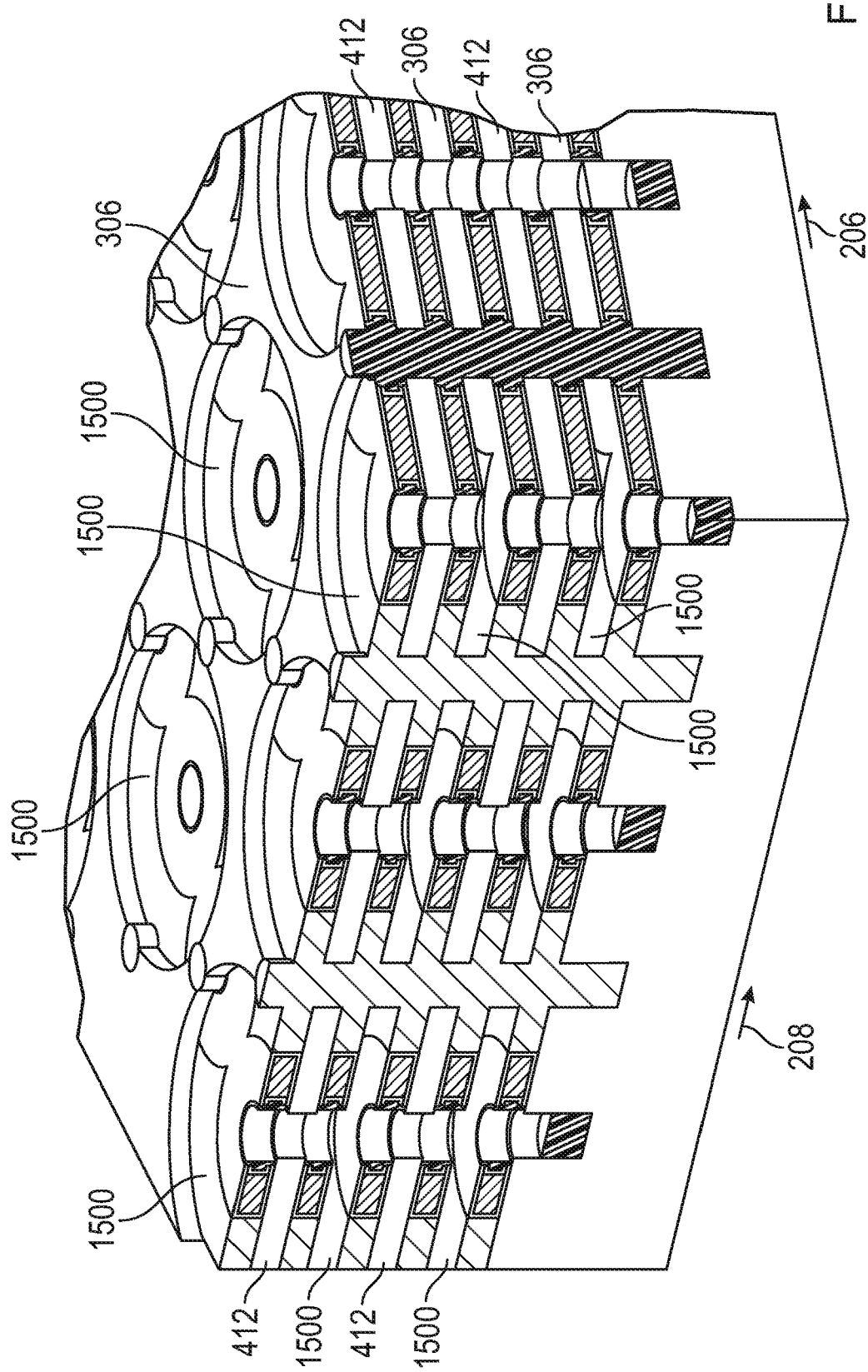

FIG. 15 provides another cut-away view, with a horizontal cut taken through one of the dielectric device layers 306, showing the structure resulting from partially back-etching the dielectric device layers 306 around the opened data-line pillar trenches 700 to form disk-shaped cavities 1500 (or ring-shaped cavities surrounding the pillar trenches 700). The etchant used for this purpose is selected to etch merely the dielectric device layers 306, but not the dielectric separation layers 412 between the device tiers 410. As can be seen, in particular, in the top cut-away plane, the cavities 1500 may be larger in diameter than the transistor gates 314, allowing space in the cavity 1500 to form transistor channels 310 that overlap horizontally (i.e., in a top-down view) with the transistor gates 314 in the electrically conductive device layers 304, as well as capacitor node plates 312 surrounding the transistor channels 310. In some embodiments, the dielectric device layers 306 are etched all the way to the ground pillars 216.

Figure 16:
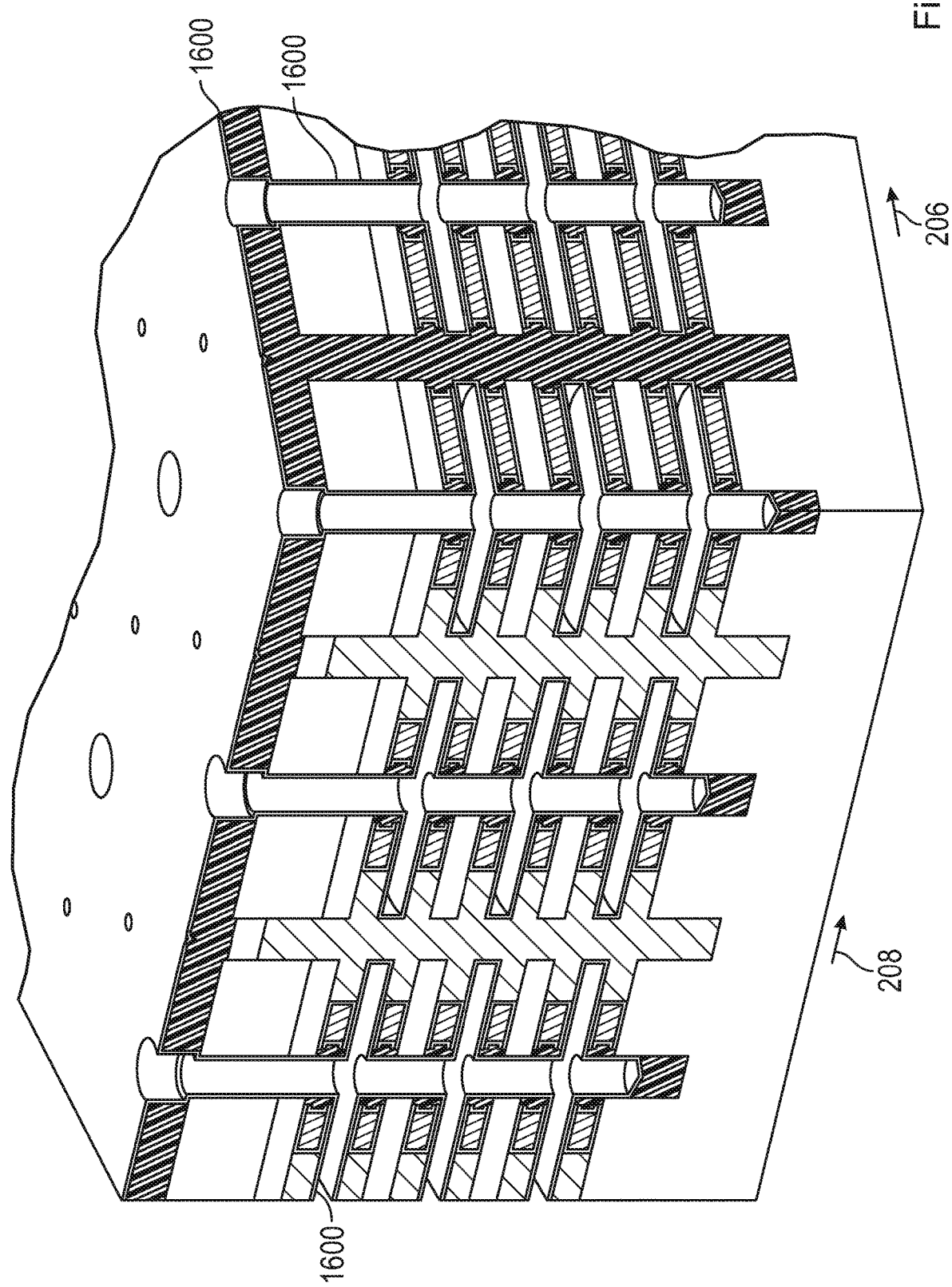

In FIG. 16, another HiK layer 1600 has been deposited over the substrate assembly to line the interior surface of the data-line pillar trenches 700 and the surrounding cavities 1500.

Figure 17:
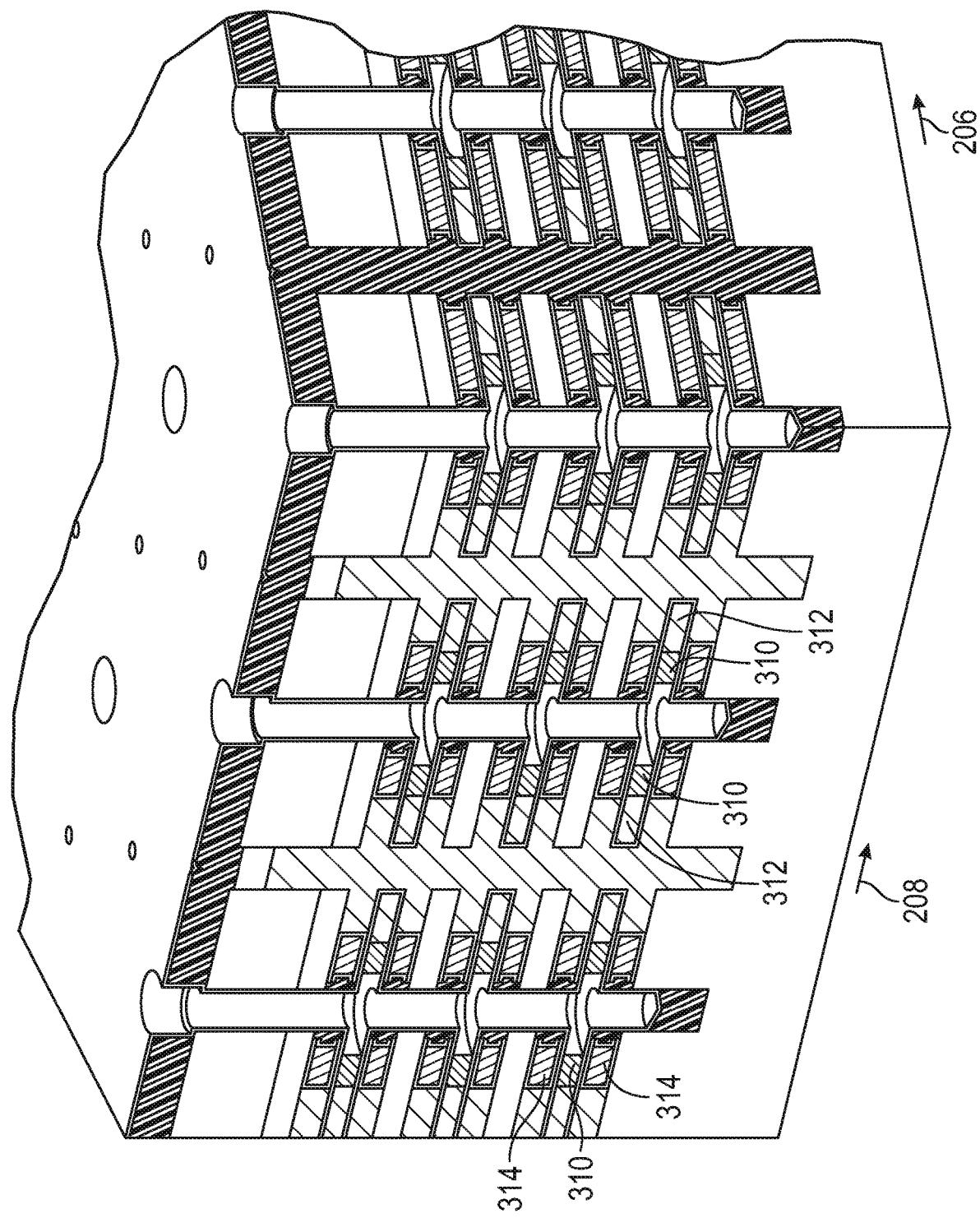

FIG. 17 shows the structure after capacitor node plates 312, followed by transistor channels 310, have been formed in the HiK-line cavities 1500 of the dielectric device layers 306. The capacitor node plates 312 may be made, e.g., from doped polysilicon (or such other material as is used in the substrate assembly 400 for the conductive device layers 304). The capacitor node plates 312 may be formed by filling the data-line pillar trenches 700 with the capacitor material (e.g., doped polysilicon), and then partially back-etching the material to leave outer rings of capacitor material whose inner diameter is still larger than the trench diameter. The pillar trenches 700 and remaining space within the cavities 1500 can then be filled with a suitable material for the transistor channel 310, generally a wide-bandgap material such as, e.g., undoped polysilicon. This wide-bandgap material is likewise etched back to open the pillar trenches 700 and form inner rings (slightly recessed from the trench diameter) of wide-bandgap material constituting the transistor channels 310.

Figure 18:
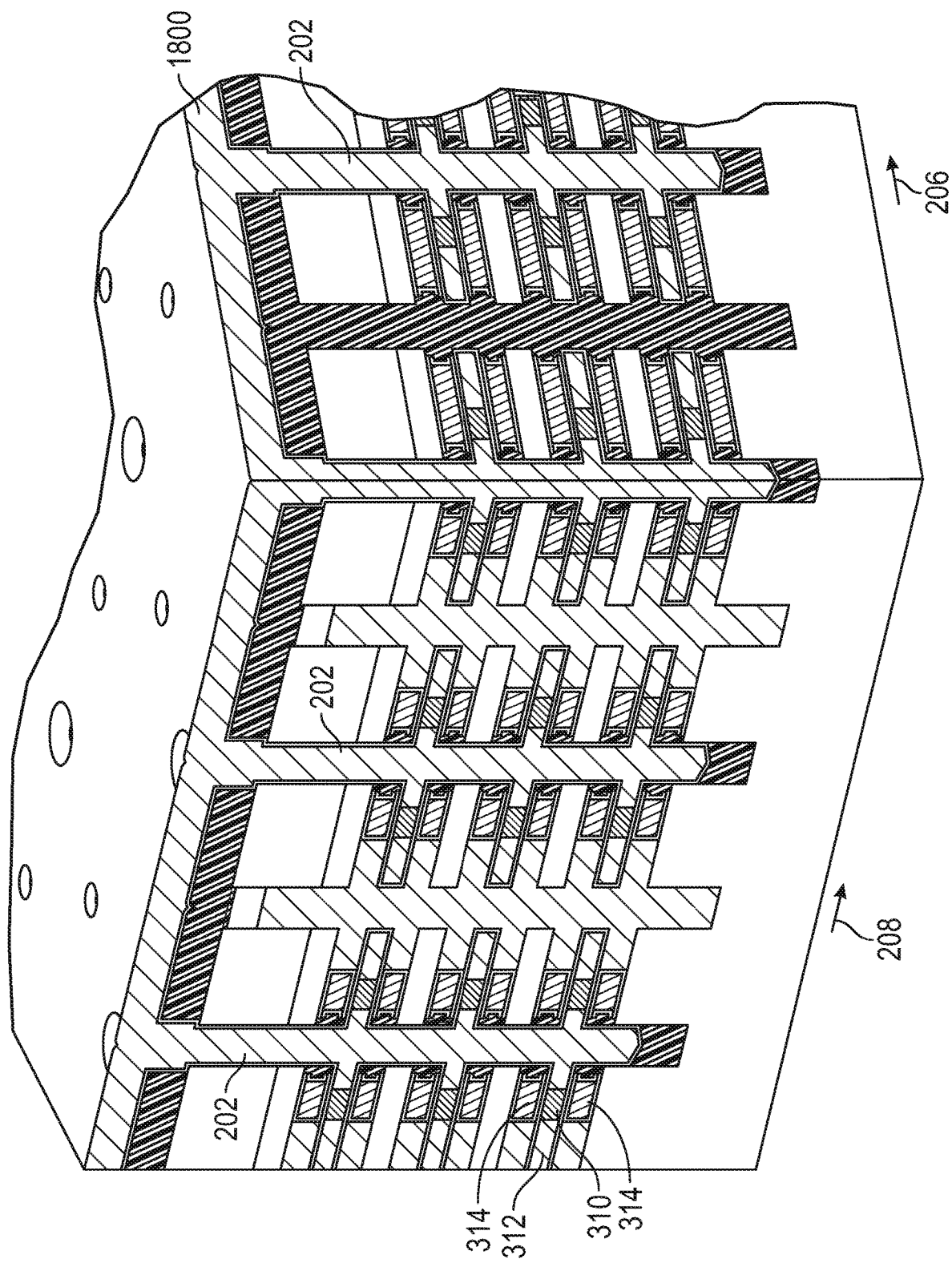

FIG. 18 shows the structure once the data-line pillar trenches 700 have been filled with an electrically conductive material 1800, such as doped silicon, to form the data-line pillars 202. This step completes the creation of the memory cells, each of which includes a transistor and capacitor. The transistor is formed by a ring-shaped transistor channel 310, which contacts a data-line pillar 202 at its interior surface (corresponding to the source terminal) and a surrounding ring-shaped capacitor node plate 312 at its exterior surface (corresponding to the drain terminal), and which is double-gated by the transistor gates 314 formed in the conductive device layers 304 above and below. The capacitor is formed by the capacitor node plate 312, the portions of the conductive device layers 304 thereabove and therebelow that horizontally overlap with the capacitor node plate 312, and the HiK material 1600 separating the node plate 312 from the horizontally overlapping portions of the conductive device layers 304. Note that the overlapping portions of the conductive device layer 304 are electrically connected (and, in embodiments using the same conductive material for the device layers 304 and the ground pillars 216, integrally formed) with the ground pillars 216, and, thus, effectively form capacitor ground plates.

In FIG. 19A, the material 1800 has been etched back at the top of the structure to once again expose the dielectric top layer 402 of the substrate assembly 400, and the data-line pillars 202 have been capped with a dielectric material 1900, e.g., SiOC.

Figure 19B:
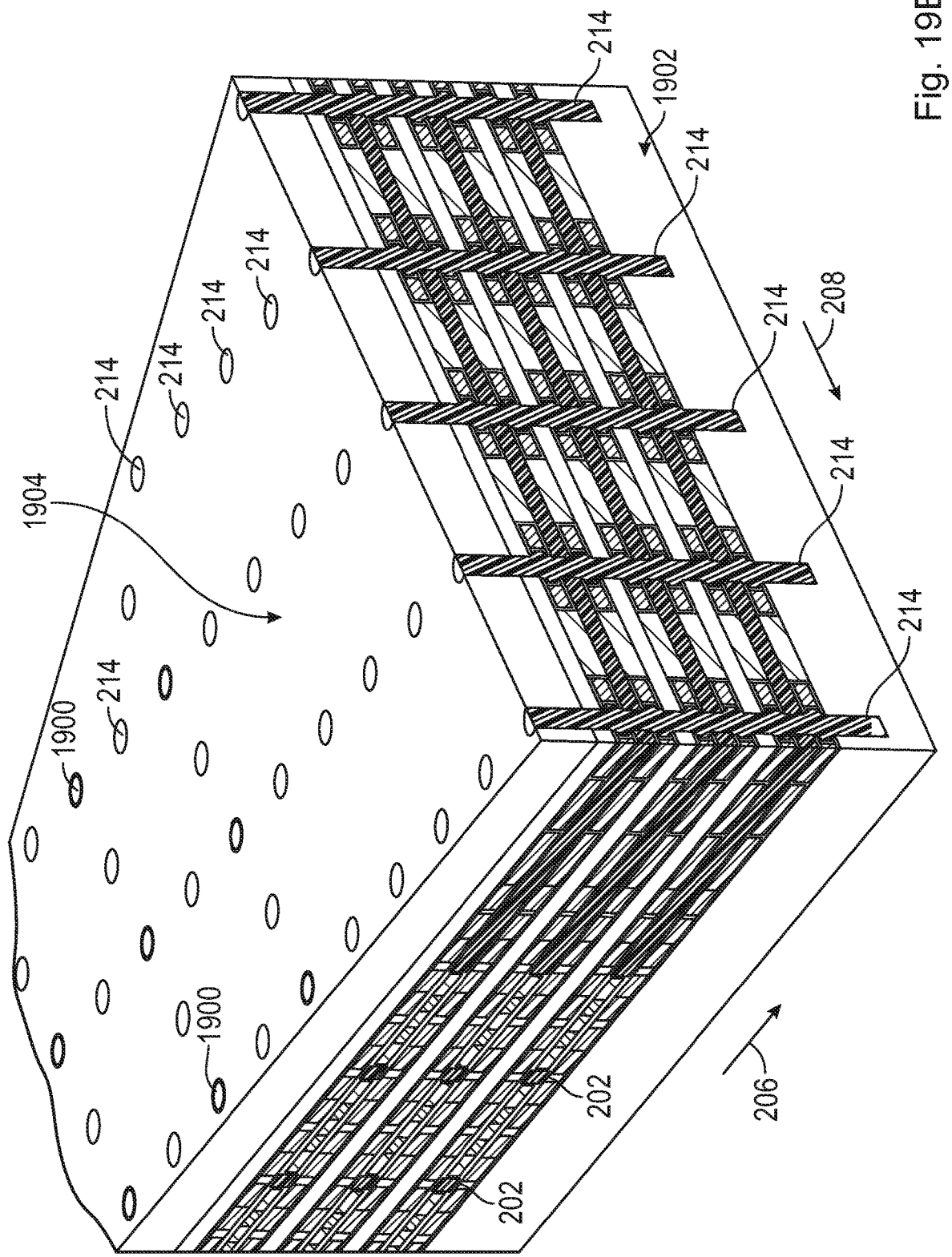

FIGS. 19B-33 illustrate a process of forming electrical connections to the 3D array of memory cells of FIGS. 4-19A, again with a series of cut-away perspective views showing the intermediate structures resulting from various steps of the process. The starting point is the structure of FIG. 19A, which is, in FIG. 19B, shown rotated by about 90° about the vertical direction, exposing the backside of the structure that was previously hidden from view. Note that the regular arrangement of data-line pillars 202, dummy pillars 214, and ground pillars 216 does not extend all the way across the substrate assembly 400, Rather, in a portion of the substrate assembly generally indicated at 1904, only dummy pillars 214 are formed. (Also note that the dummy pillars are surrounded by conductive rings structurally similar or identical to the transistor gates, which, however, serve merely to form portions of the access lines.) This region (hereinafter also referred to as the "contacts region") may be used to establish electrical connections to the access lines 1200. In general, making the electrical connections involves creating a staircase structure in the substrate assembly to expose various device tiers.

Figure 20:
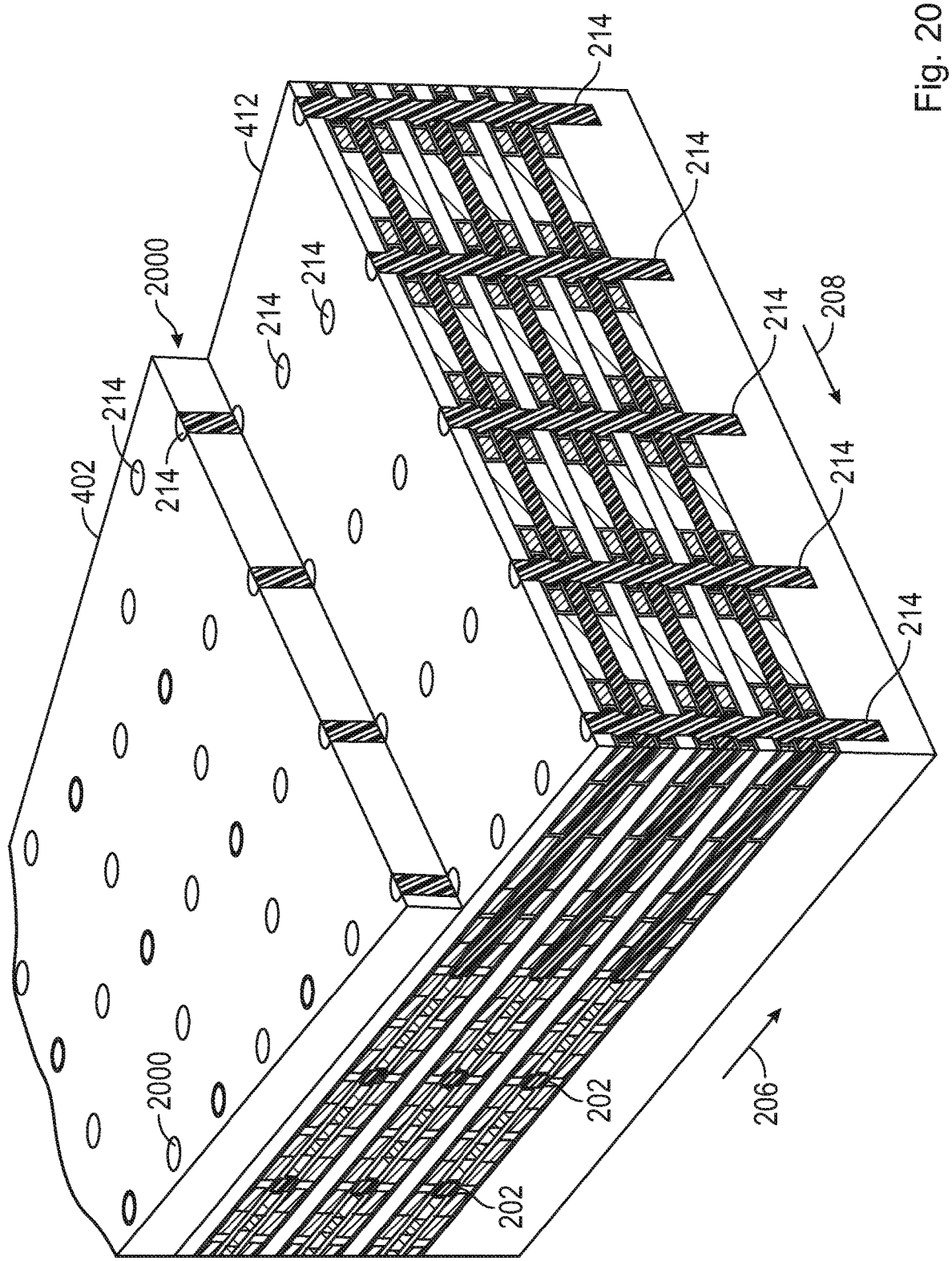

FIG. 20 shows a top step 2000 resulting from etching the dielectric top layer 402 down to the uppermost dielectric separation layer 412 in the contacts region 1904 while leaving the dielectric top layer 402 in place above the array portion including data-line, dummy, and ground pillars 212, 214, 216. The etch can be confined to the contacts region 1904 by covering the substrate assembly with a resist and patterning the resist by photolithography to remove only portions of the resist in the contacts region 1904.

Figure 21:
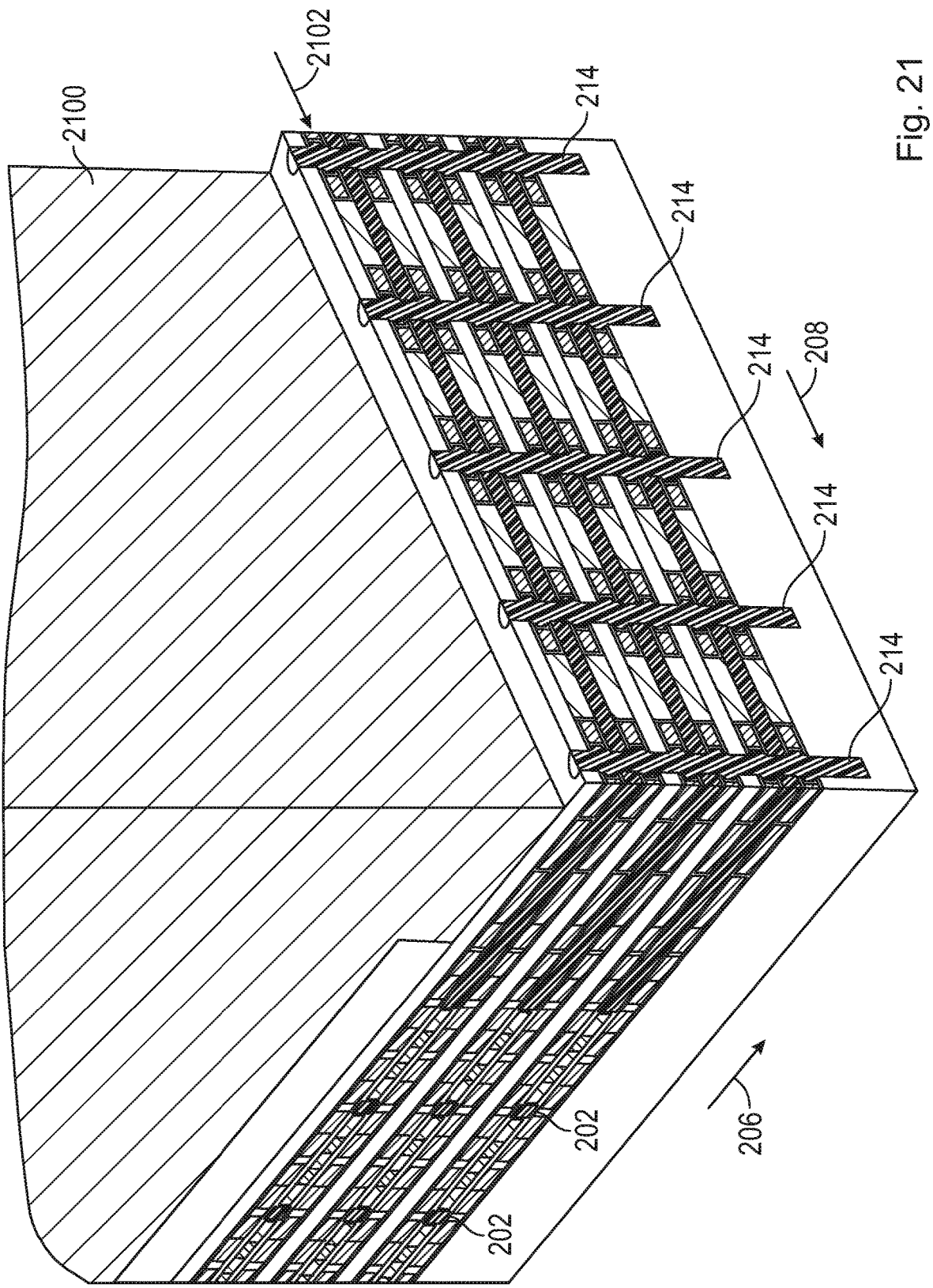
Figure 22:
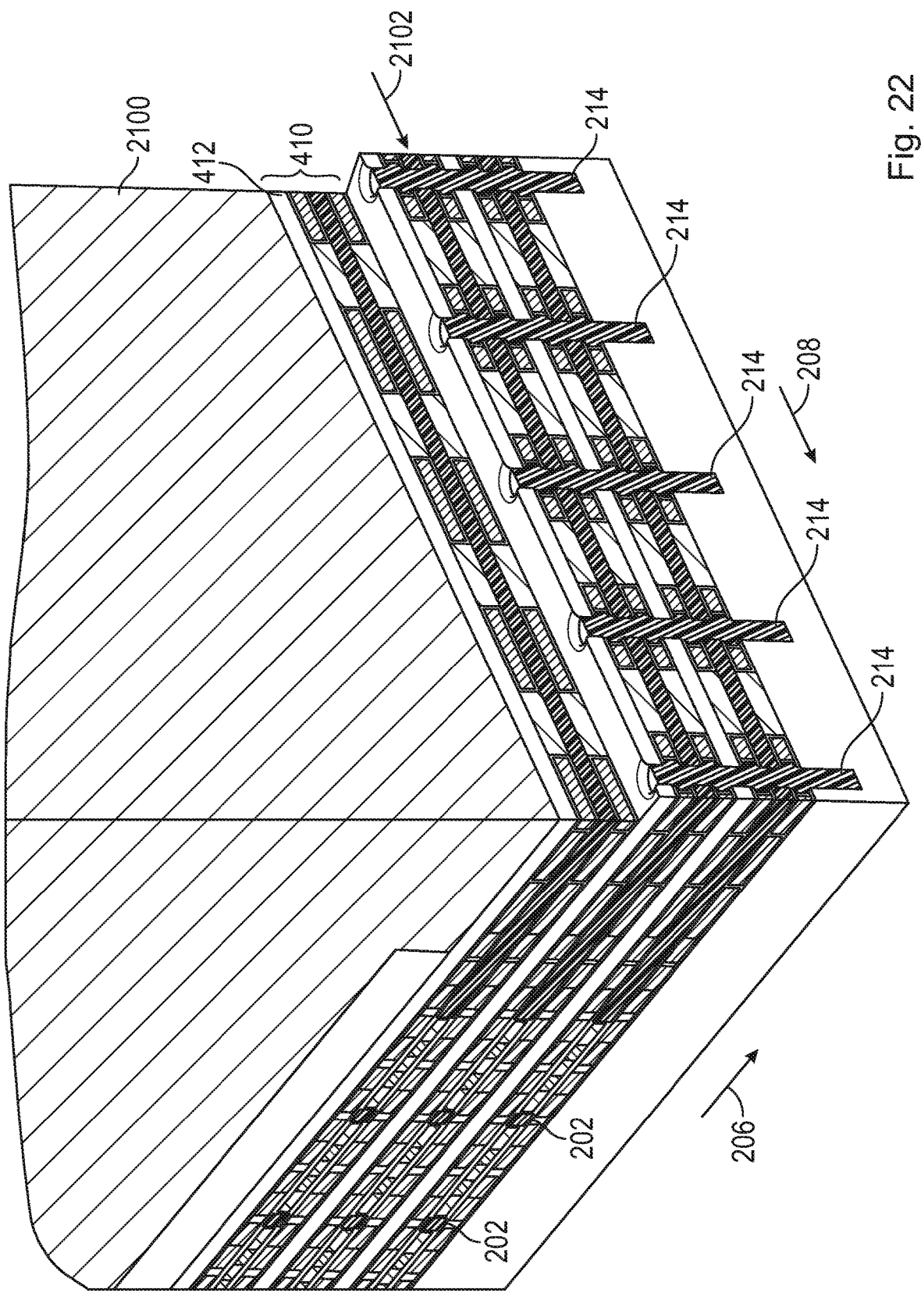

FIG. 21 shows a layer of resists 2100 deposited over the structure and trimmed to expose only one row 2102 (in the second horizontal direction 208) of dummy-line pillars 214. FIG. 22 shows the staircase structure after the top-most device tier 410 (encompassing the top-most dielectric device layer 306 and its adjacent conductive device layers 304) and separation layer 412 thereabove have been etched away in the exposed row 2102 of dummy-line pillars 214.

Figure 23:
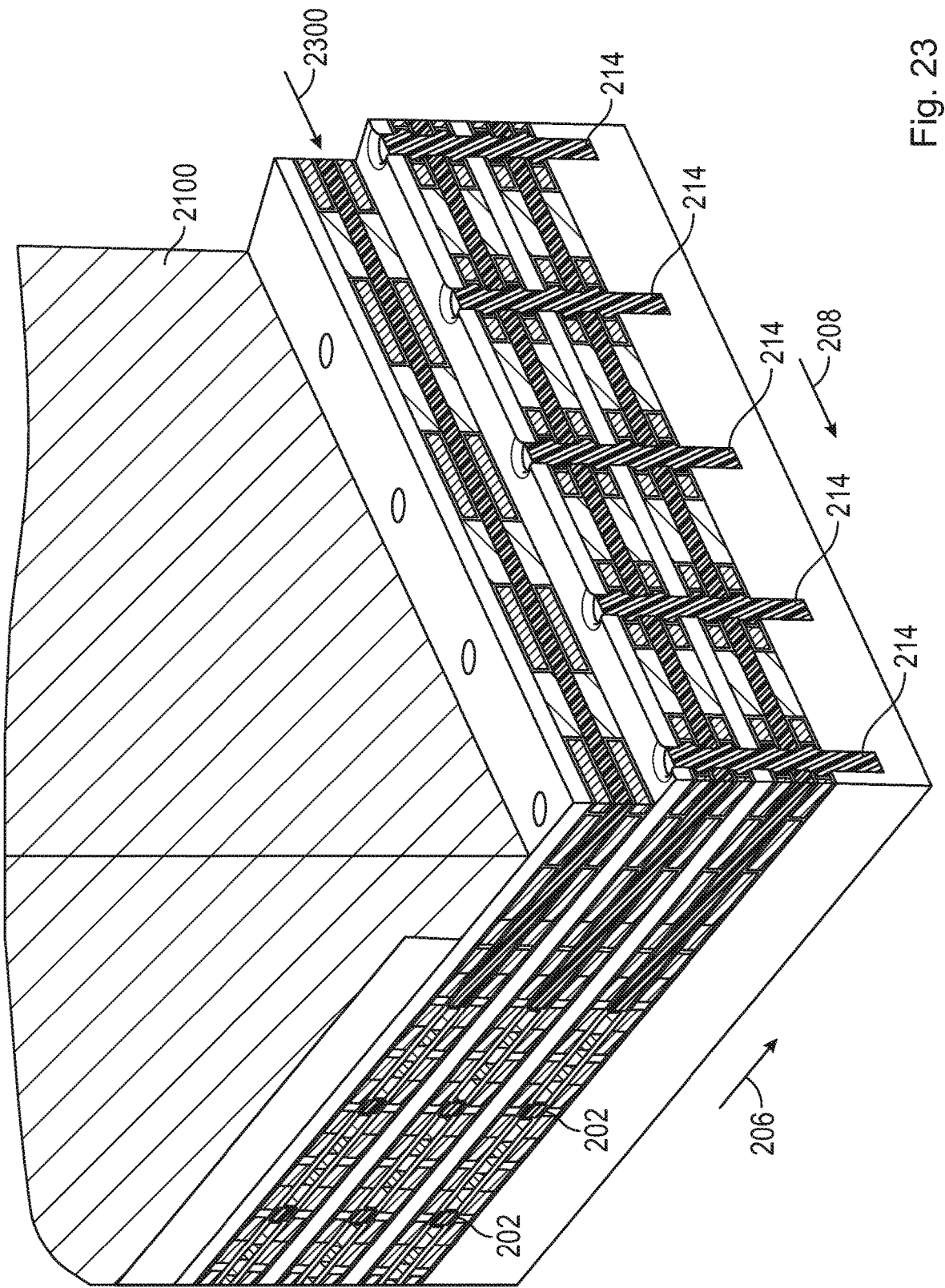
Figure 24:
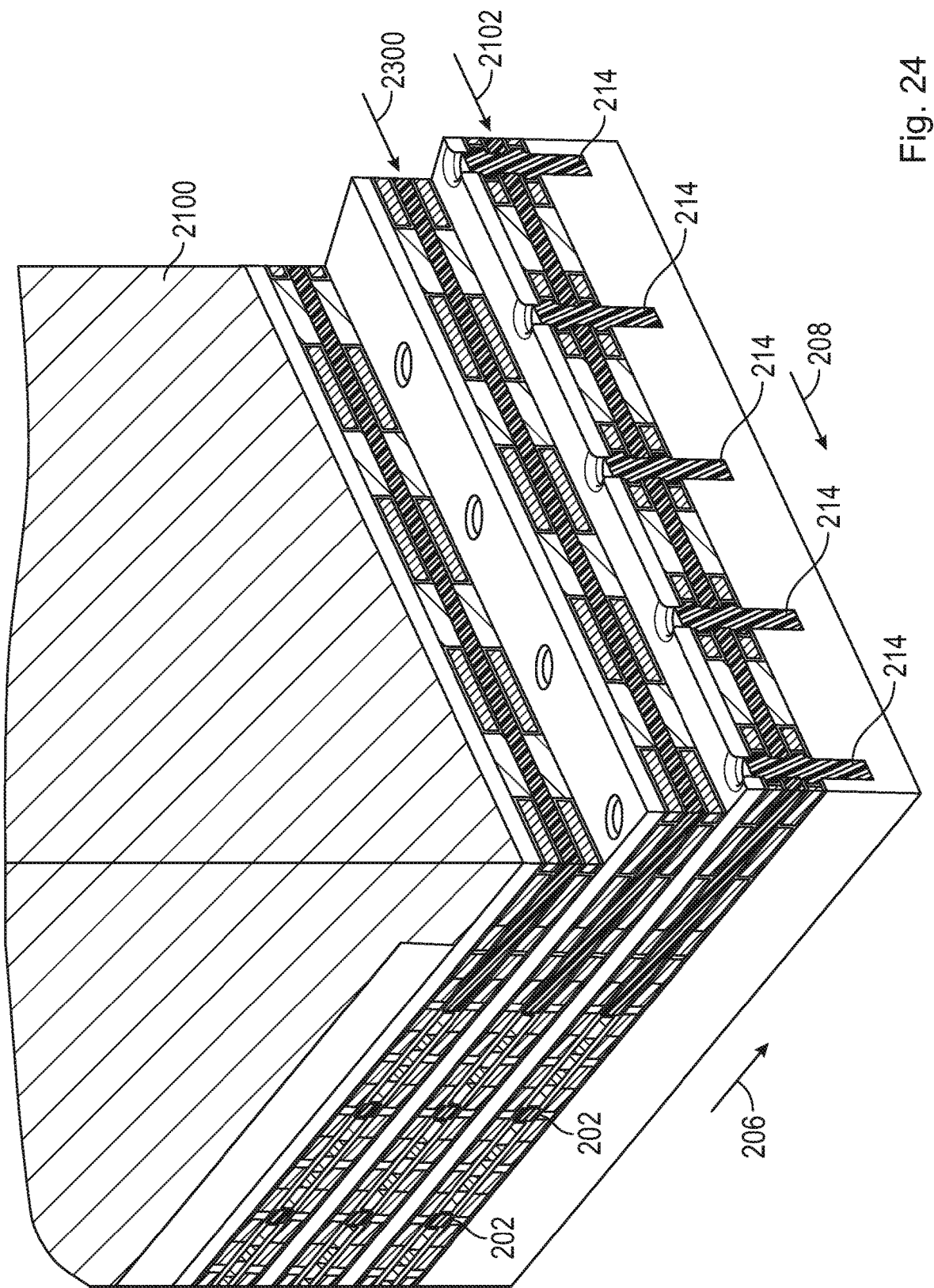

FIG. 23 shows the resist 2100 trimmed back further to now expose the next row 2300 of dummy line pillars 214. FIG. 24 shows the staircase structure after the top-most device tier 410 and associated separation layer 412 have been etched away in the second row 2300, and the next-lower device tier 410 and associated separation layer 412 have simultaneously been etched away in the first row 2102. Note that the etch rate is substantially uniform across the exposed surface, such that all previously created steps are etched down by the same thickness of material.

Figure 25:
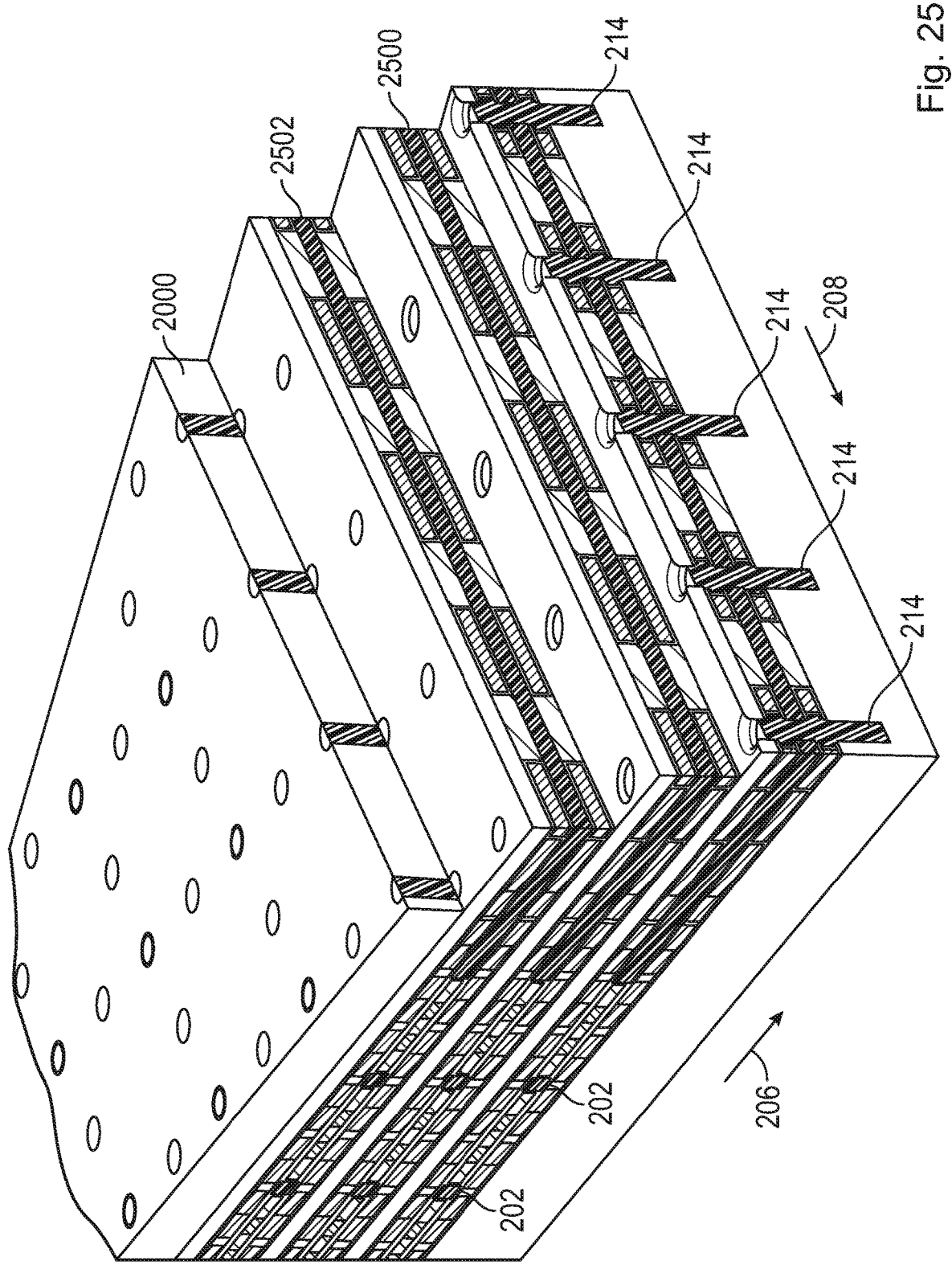

FIG. 25 shows the staircase structure following removal of the resist 2100, revealing three steps 2500, 2502, 2000 corresponding to the three device tiers 410 (each covered by its respective dielectric separation layer 412) in the depicted example embodiment. As will be appreciated by those of ordinary skill in the art, the process of trimming the resist and etching down one device tier can generally be repeated as many times as needed to accommodate any number of device tiers in any given 3D array.

Having created a staircase structure that will allow contacting the access lines at different device tiers 410, the structure is further modified, in the following steps, to facilitate contacting both access lines 1200 within each device tier 410 of the double-gated embodiment with the same electrical contact.

Figure 26:
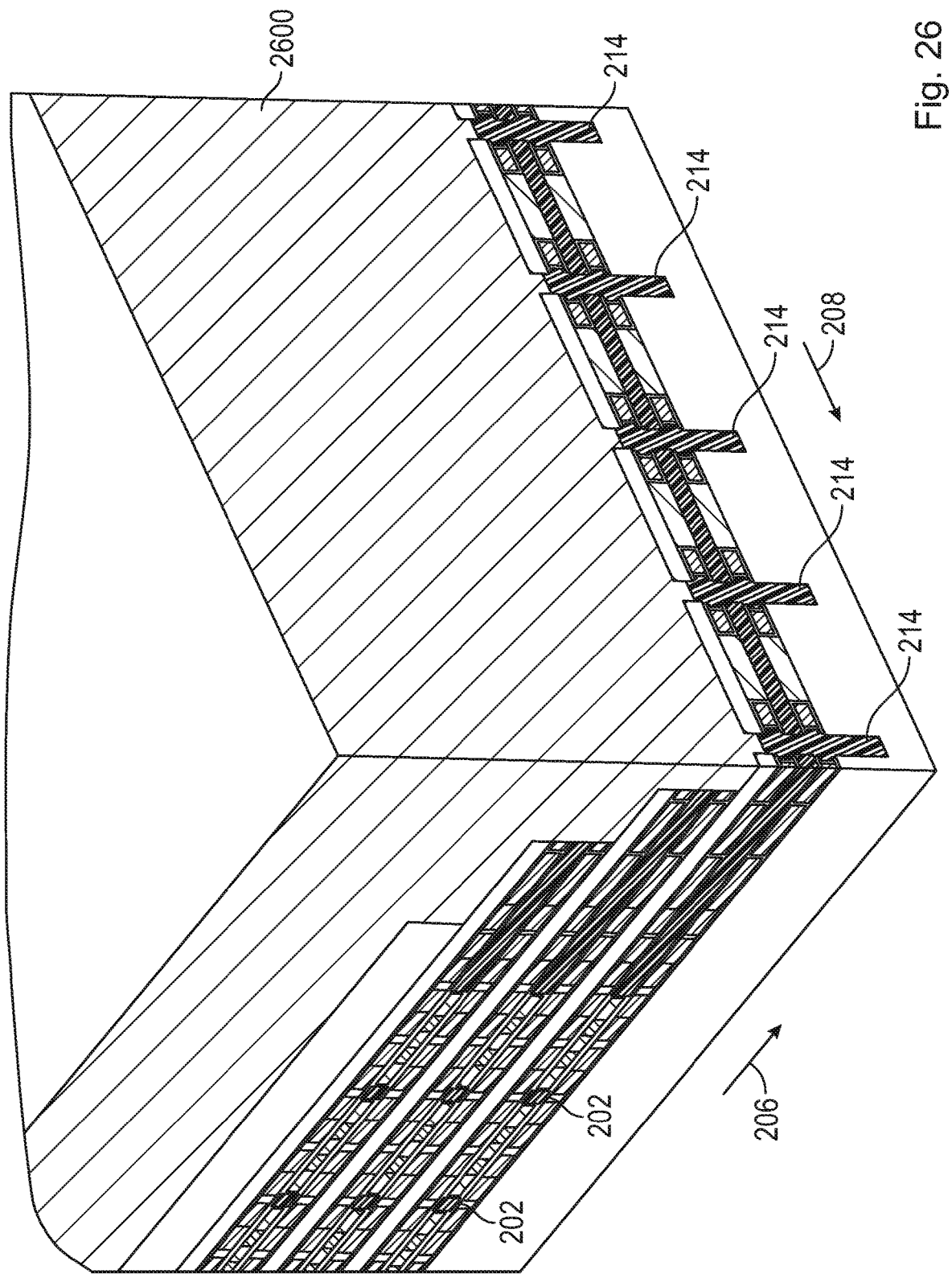
Figure 27:
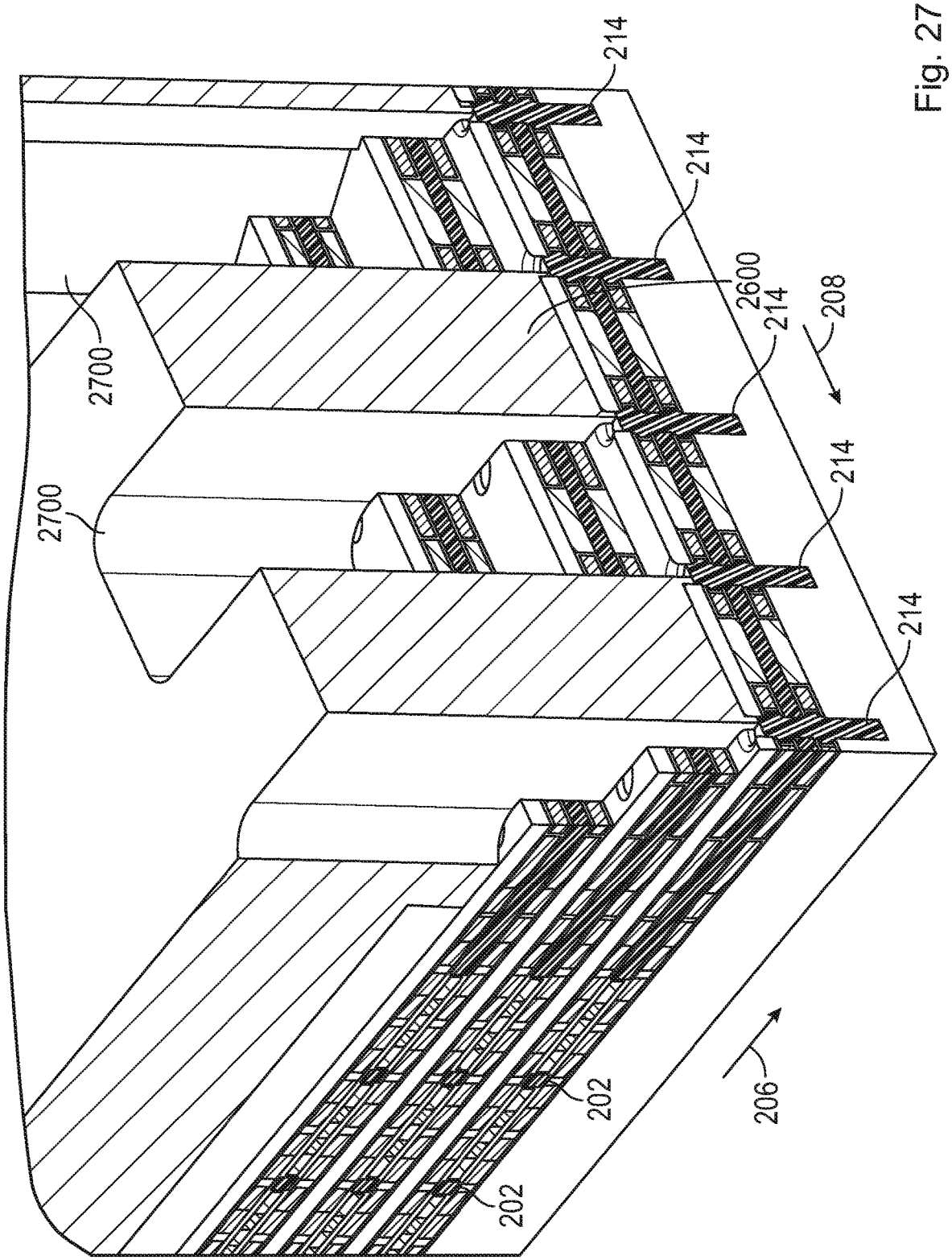
Figure 28:
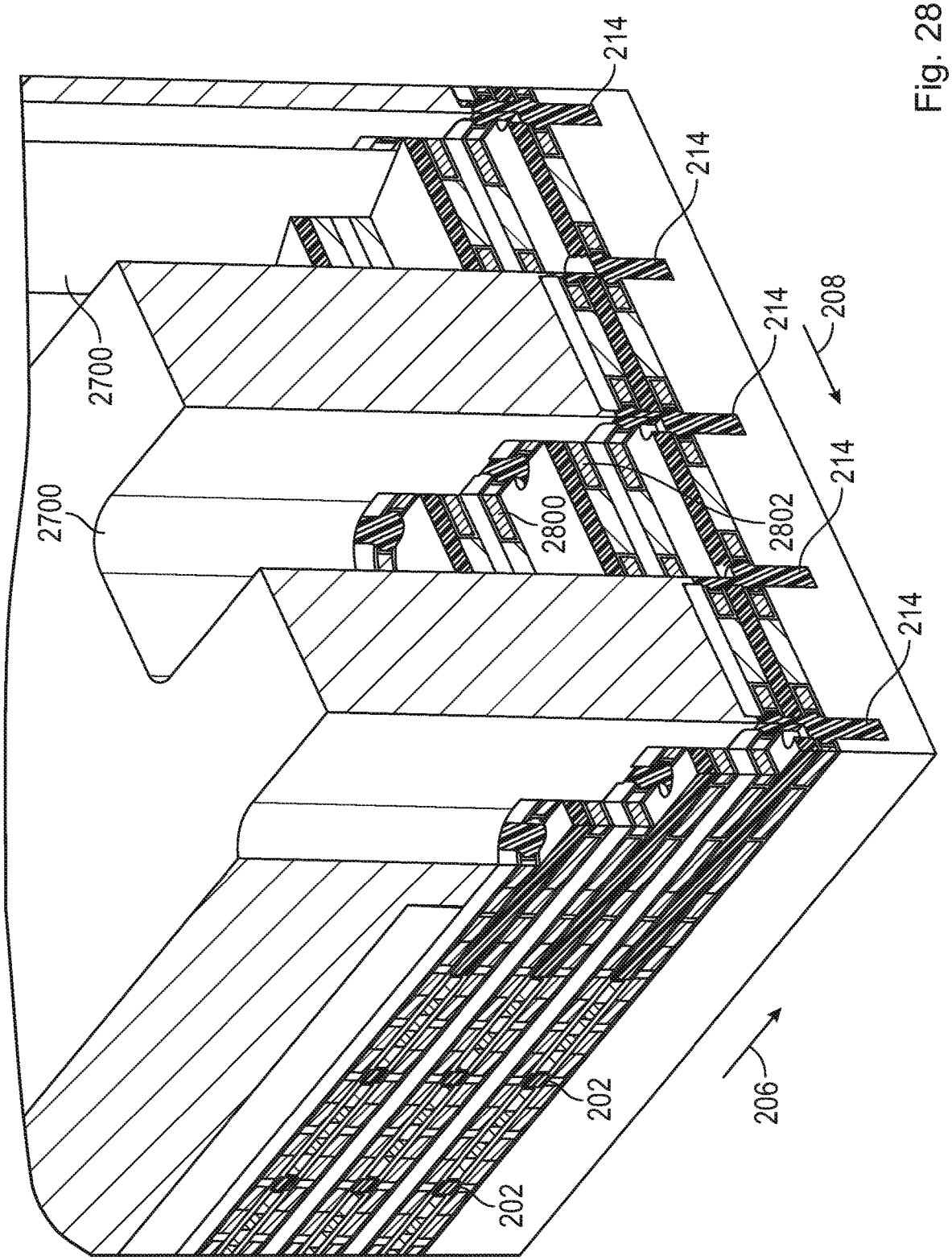
Figure 29:
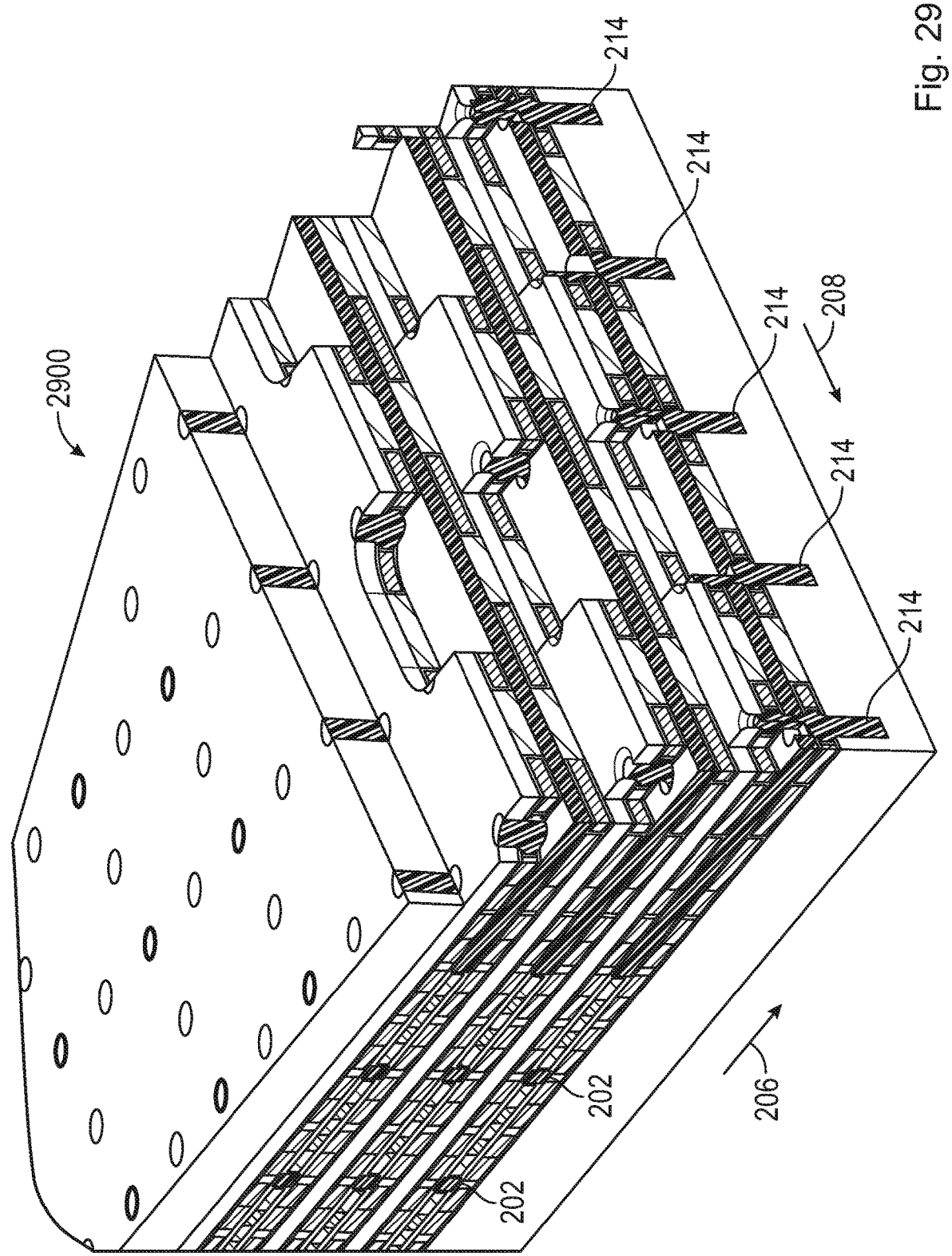

Continuing with FIG. 26, the staircase structure is shown with a new layer of resist 2600 disposed on top. FIG. 27 shows the resist 2600 patterned to form slits 2700 between every other pairs of rows of dummy-line pillars 214 in the first horizontal direction 206. In FIG. 28, two layers of the staircase (namely, the dielectric separation layer 412 and the upper one of the two conductive device layers 304) have been etched down in the regions of the slits 2700. As a result, vertical facets of the two access lines 1200 of a single device tier 410 are exposed at different horizontal positions (as opposed to lying in the same vertical plane as they did previously). For example, FIG. 28 calls out the two access lines 2800, 2802 of the second device tier. FIG. 29 shows the etched structure 2900 after the resist 2600 has been stripped.

Figure 30:
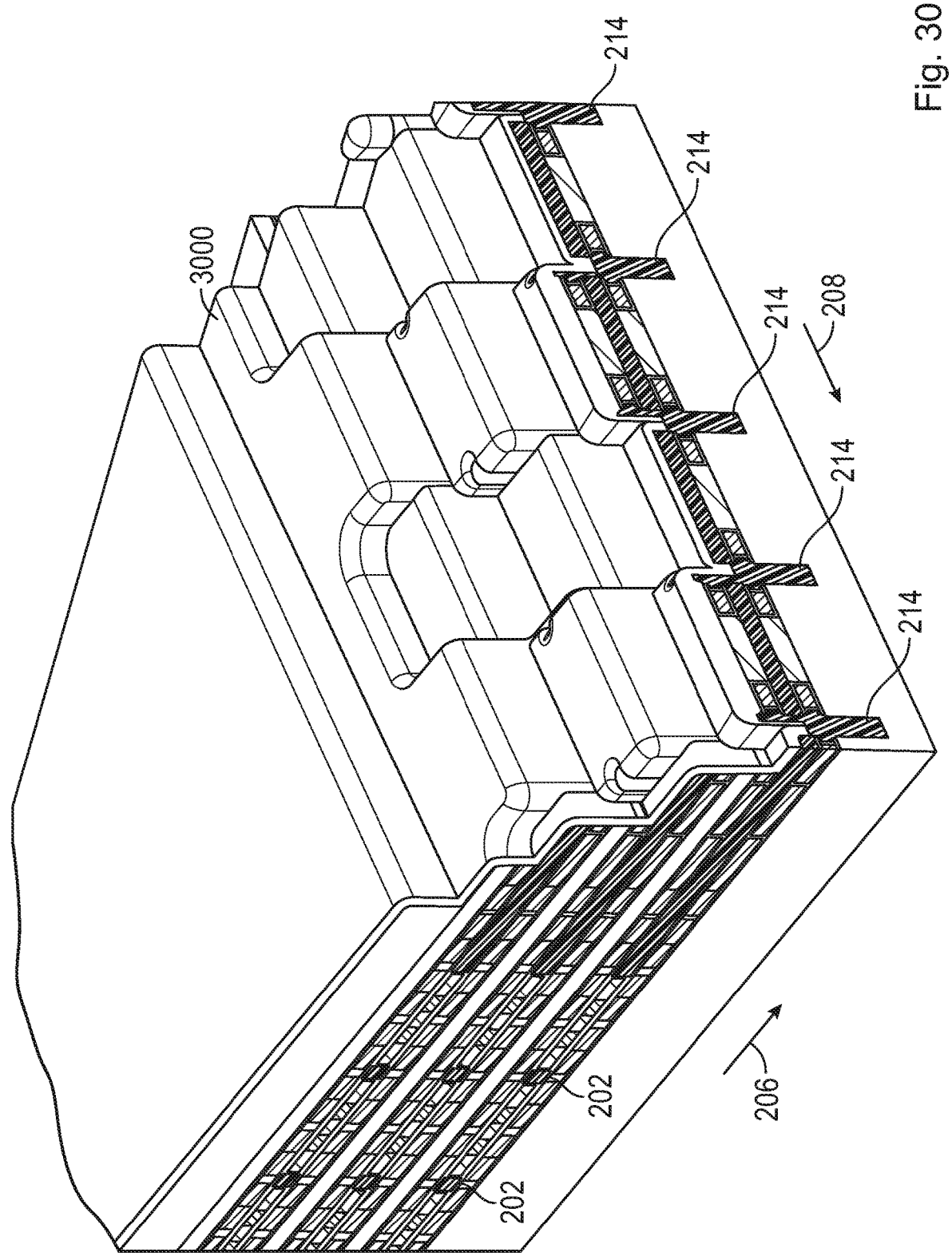
Figure 31:
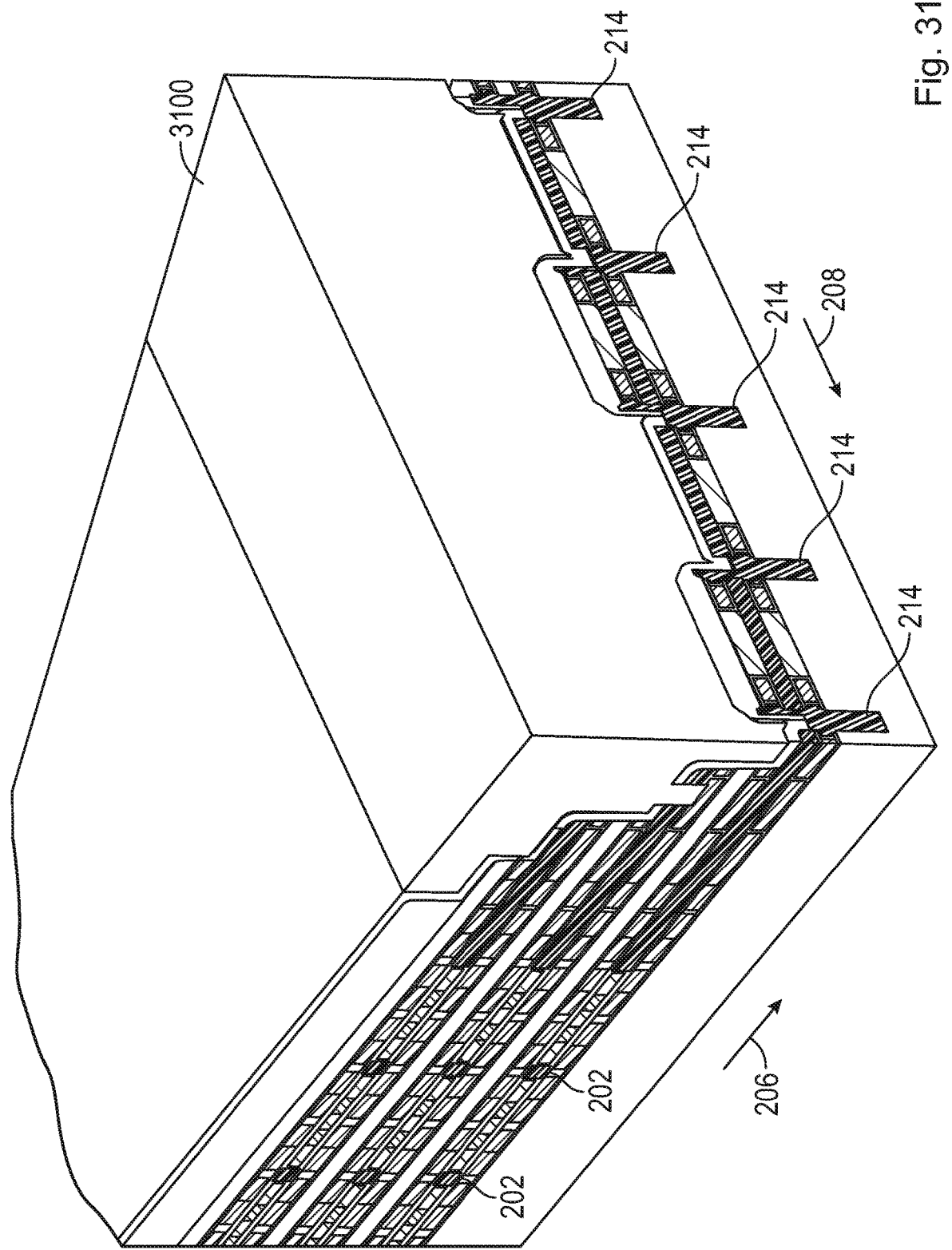
Figure 32:
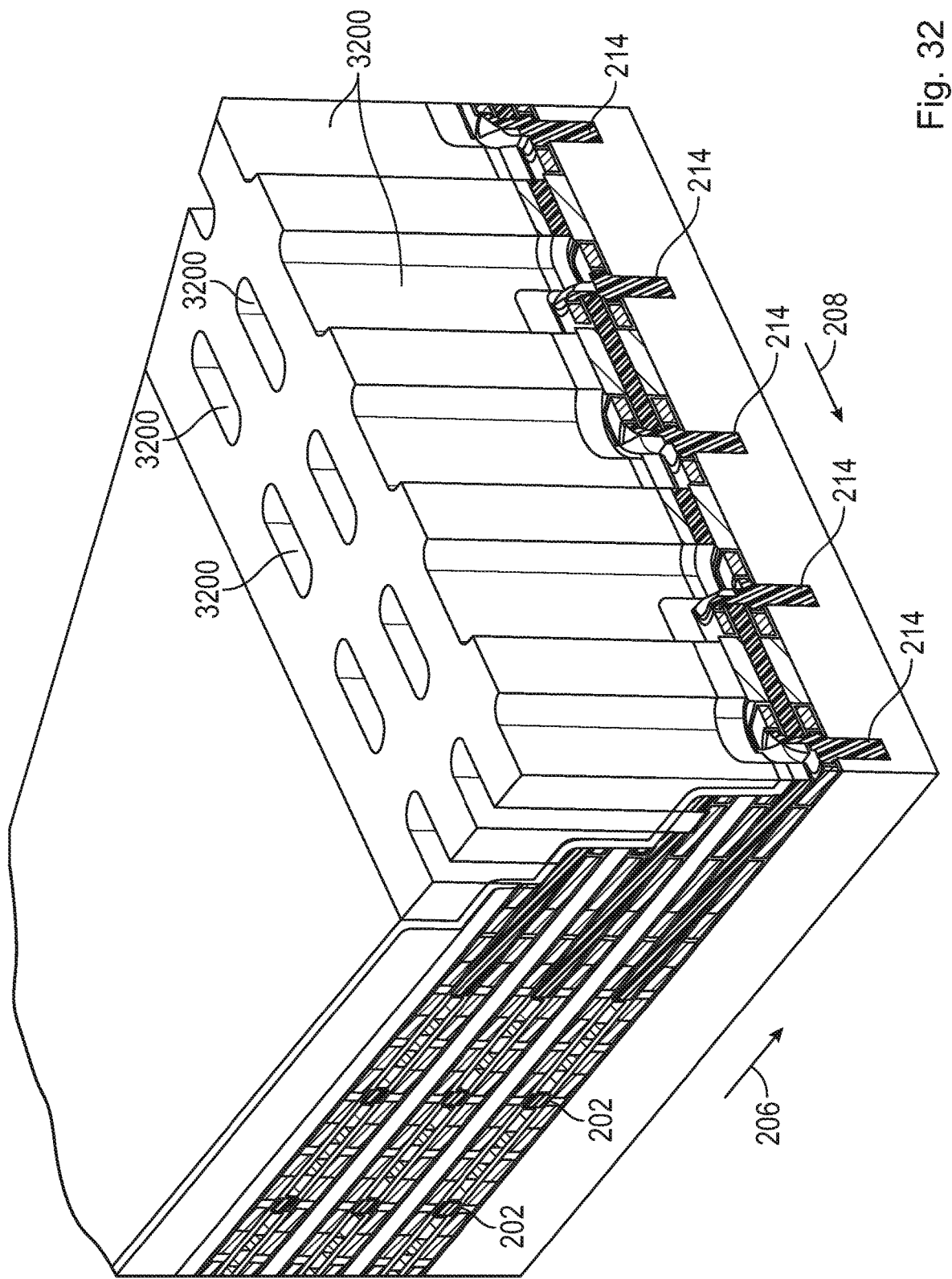
Figure 33:
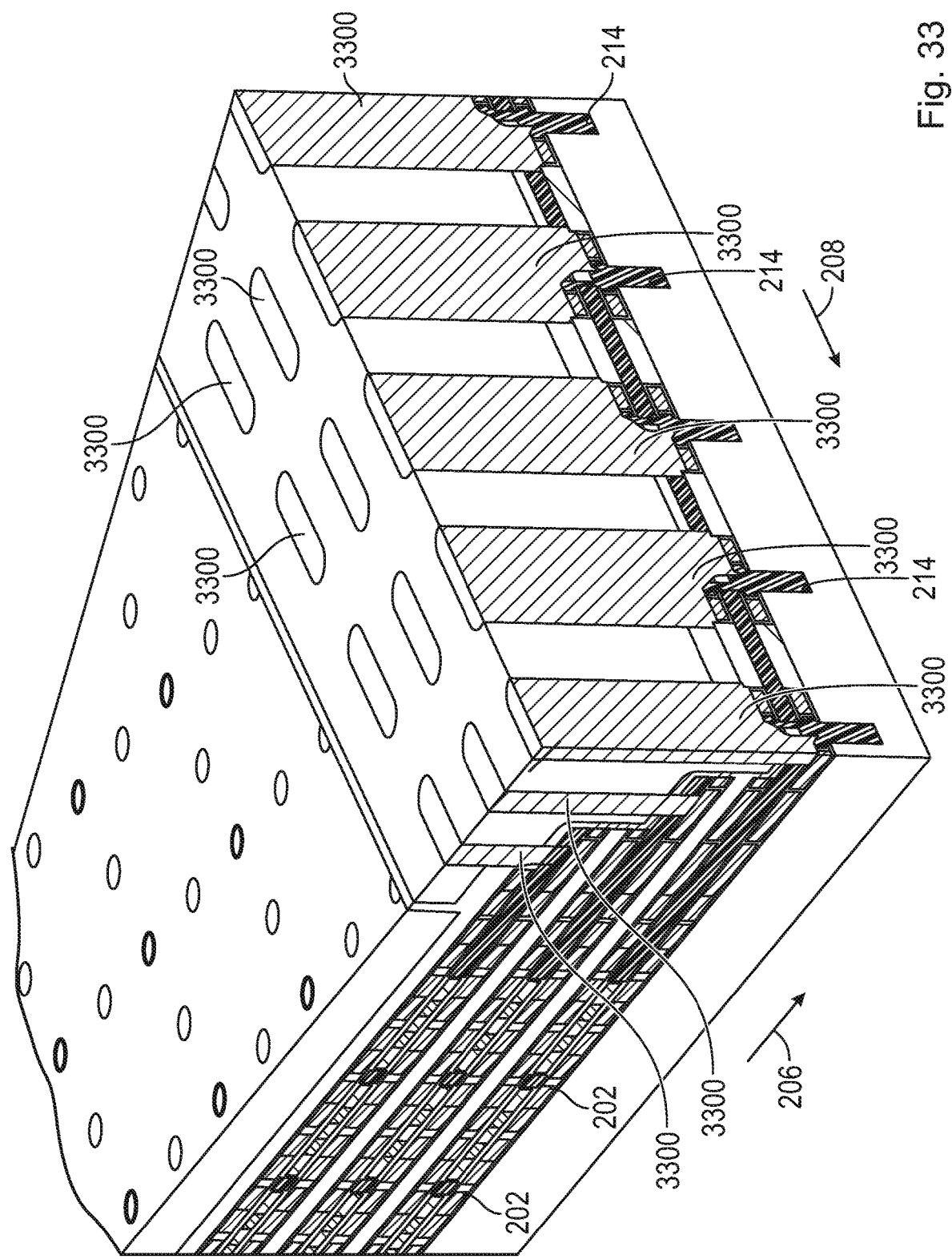

The remaining steps serve to create vertical vias that provide electrical contacts for the access lines 1200. In FIG. 30, a dielectric etch stop layer 3000, e.g., of SiN, has been deposited over the entire structure 2900. FIG. 31 shows the region above the staircase filled in with a contact oxide 3100, which has been polished back, e.g., using chemical mechanical polishing (CMP) to form a planarized top surface. In FIG. 32, the contact oxide 3100 has been patterned and etched to open pillar trenches 3200 for contact vias above each of the dummy-line pillars 214 in the contacts region 1904. In FIG. 33, these pillar trenches 3200 have been filled in with a metal or other conductive material to form the contact vias 3300, one for each pair of access lines 120 in each device tier 410. With suitable peripheral circuitry, these vias 3300, and thus each row 210 of memory cells, can be addressed individually.

FIGS. 34-37 further illustrate the 3D RAM array structure created by the process of FIGS. 4-33 by showing various components and combinations of components in isolation.

Figure 34:
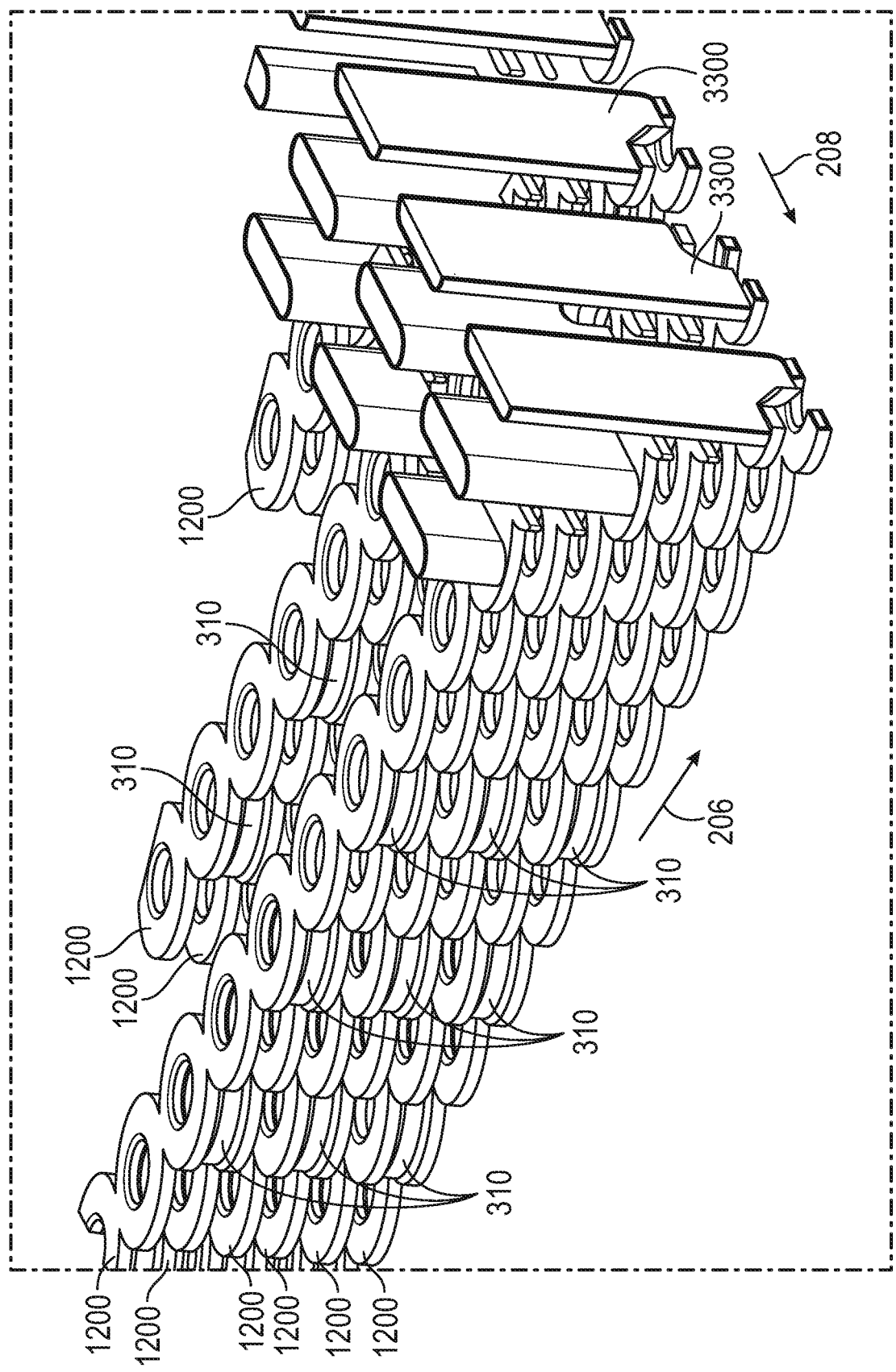
FIG. 34 shows pairs of access lines and the associated contact vias of the 3D array of memory cells created by the process of FIGS. 4-33 in isolation.

FIG. 34 shows, from the same perspective as FIGS. 19B-33, pairs of access lines 1200 and the associated contact vias 3300 (one via 3300 for both access lines 1200 in each row 210 of memory cells in each device tier 410). For the sake of clarity, hatching has been omitted from this figure. As can be seen, the access lines 1200 are formed by integrally connected rings. In a region of the array where the memory cells are formed, every other of these rings surrounds a data-line pillar 202 (not shown) and provides the gate 314 for the respective transistor at that location. The transistor channels 310 between each pair of access lines 1200 are also shown.

Figure 35:
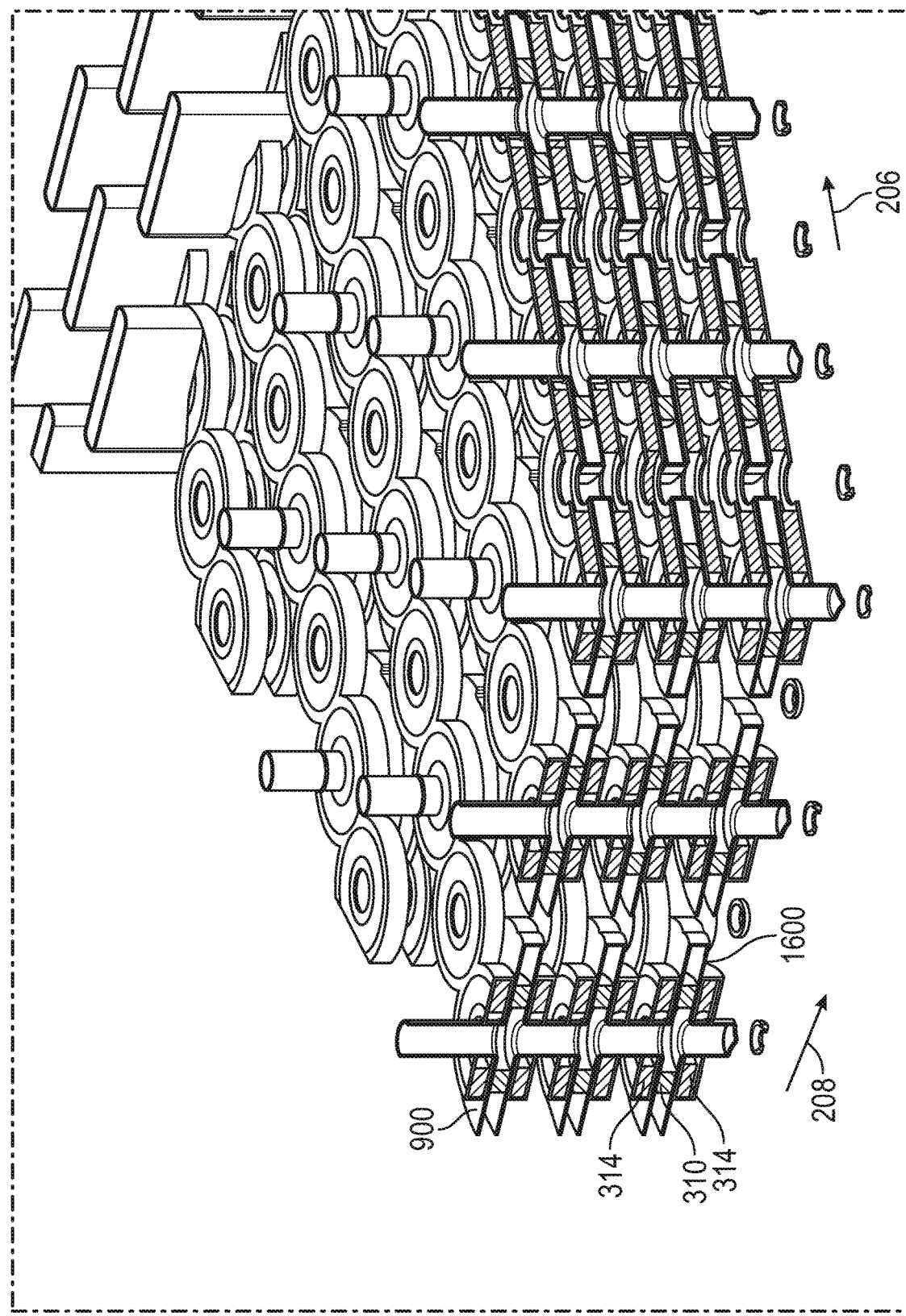
FIG. 35 shows the double-gated access transistors of the memory cells created by the process of FIGS. 4-33 in isolation.

FIG. 35 shows, from the same perspective as FIGS. 4-19A, the double-gated access transistors of the memory cells. Each access transistor is formed by a ring-shaped transistor channel 310 and ring-shaped transistor gates 314 above and below the channel 310. The HiK layers 900, 1600 that line the cavities 800, 1500 in which the transistor channels 310 and gates 314 are formed, and which electrically insulate the channels 310 from the gates 310, are also shown.

Figure 36:
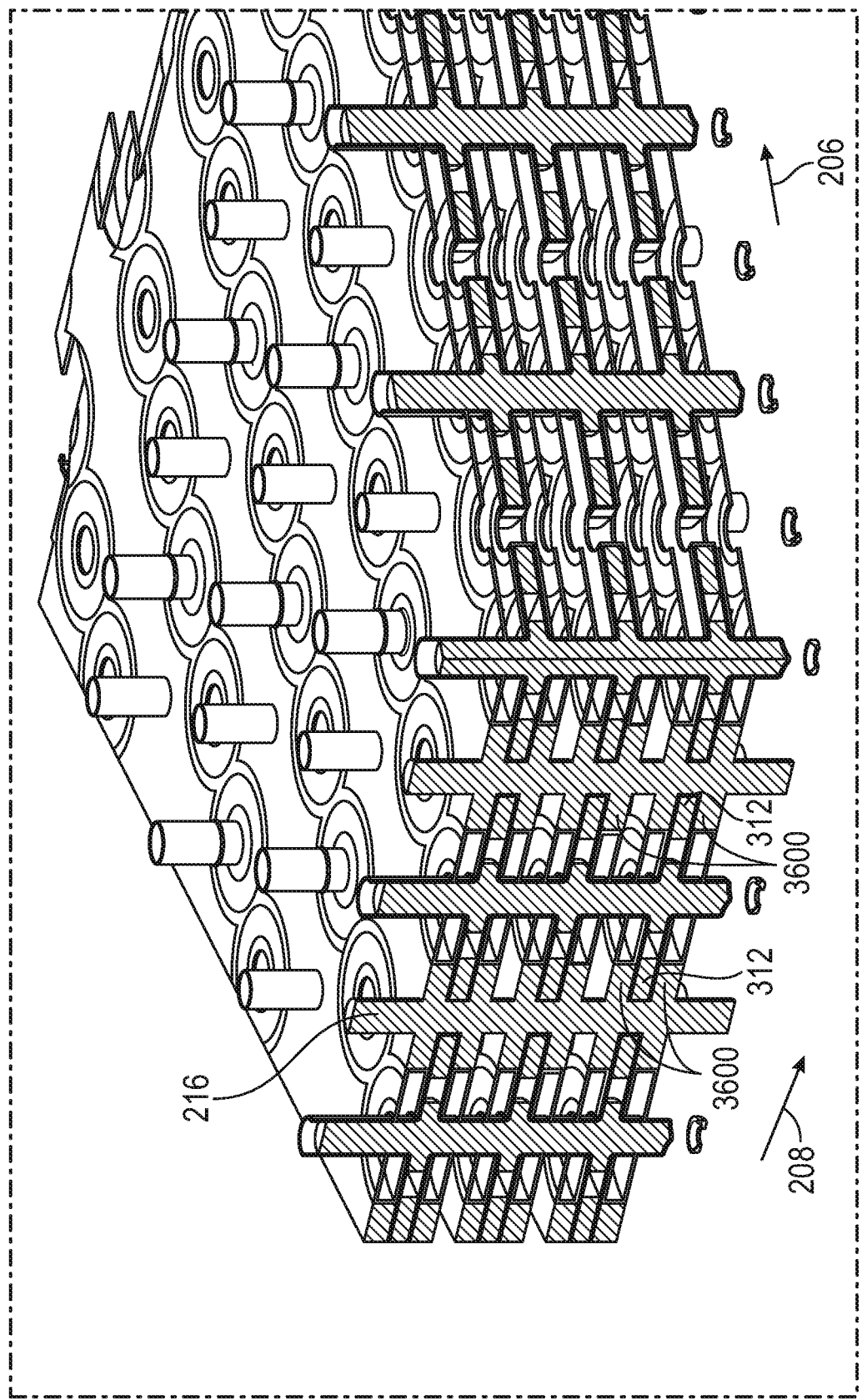
FIG. 36 shows the storage capacitors of the memory cells created by the process of FIGS. 4-33 in isolation.

FIG. 36 shows, from the same perspective as FIG. 35, the storage capacitors of the memory cells. Each storage capacitor includes a conductive ring forming the node plates 312, ground plates 3600 formed in the conductive device layers 304 above and below the node plates 312, and electrical insulation of HiK material 1600 between the node plates 312 and ground plates 3600. Also shown are the ground pillars 216, from which the ground plates 3600 extend.

Figure 37:
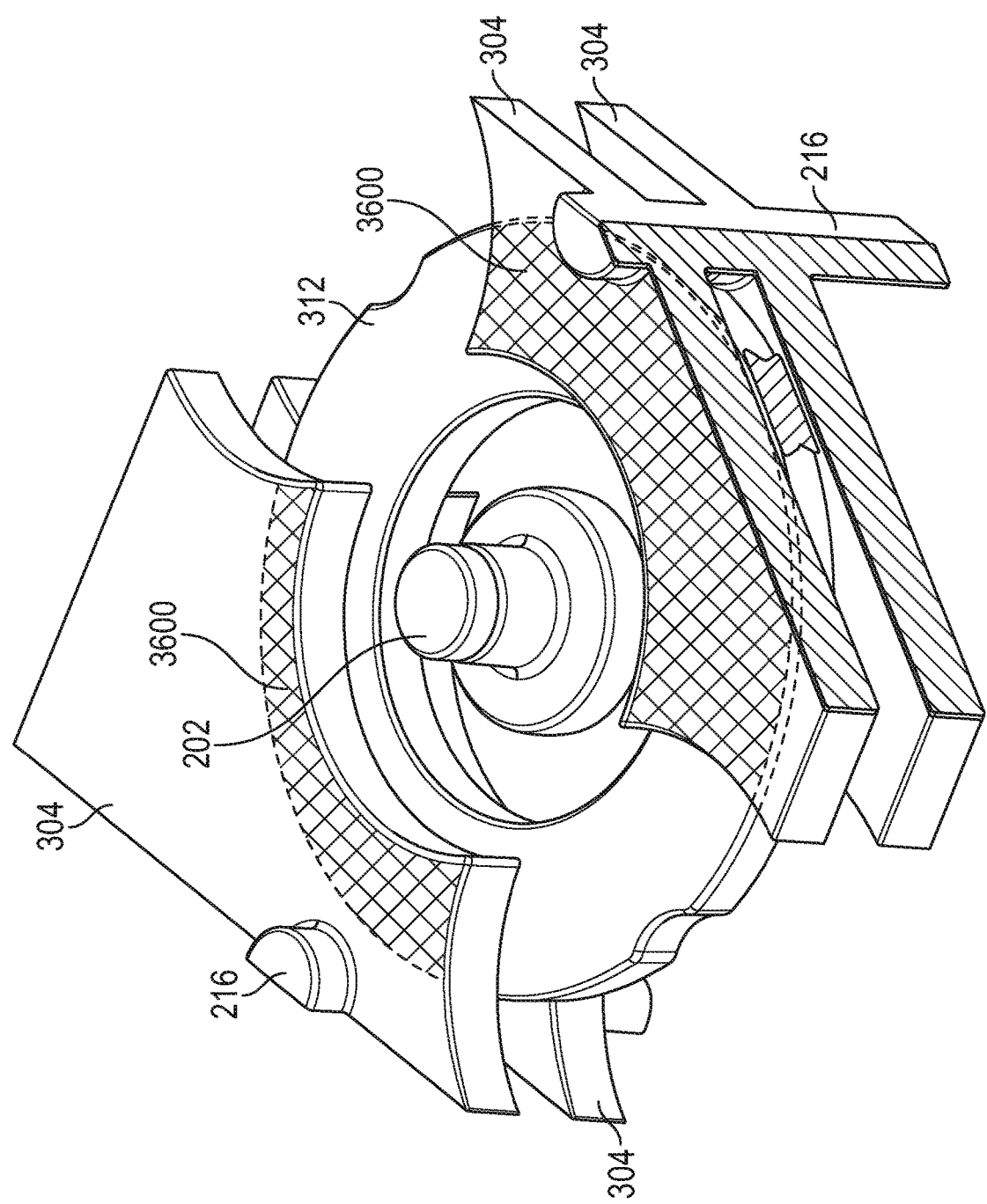
FIG. 37 shows a storage capacitor of FIG. 36 in a close-up view.

FIG. 37 provides a close-up view of the storage capacitor structure, showing the node plate 312 (surrounding data-line pillar 202) in between neighboring electrically conductive device layers 304, which are formed integrally with the ground pillars 216. The portions of the conductive device layers 304 that overlap horizontally with the node plate 312, indicated in FIG. 37 by a cross hatch and a dashed-line boundary, form the ground plates 3600, and determine the effective area of the capacitor structure.

Figure 38:
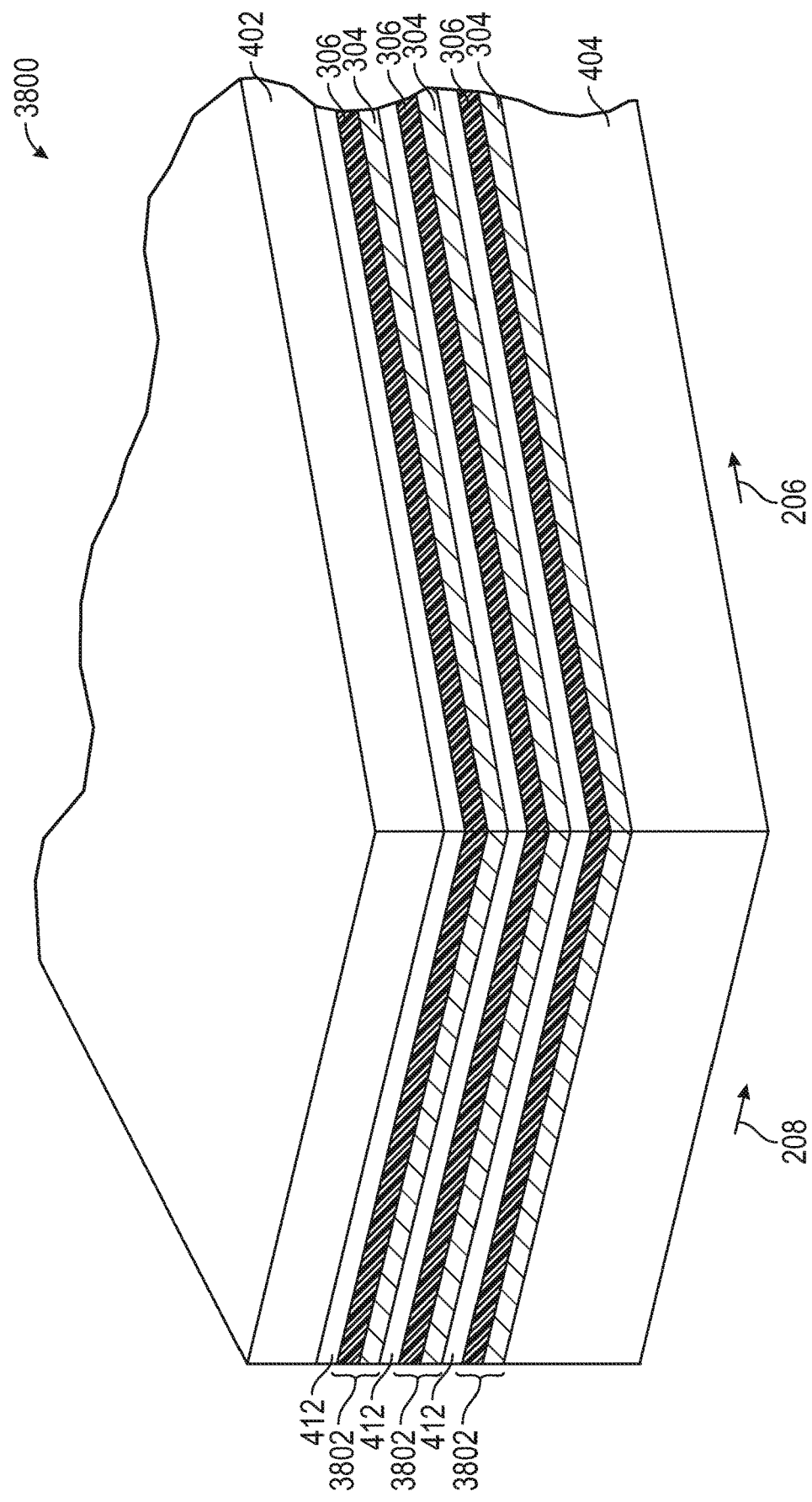
FIGS. 38-40 illustrate a layered substrate assembly and a 3D array of memory cells with single-gated transistors formed therein, according to one embodiment.
Figure 39:
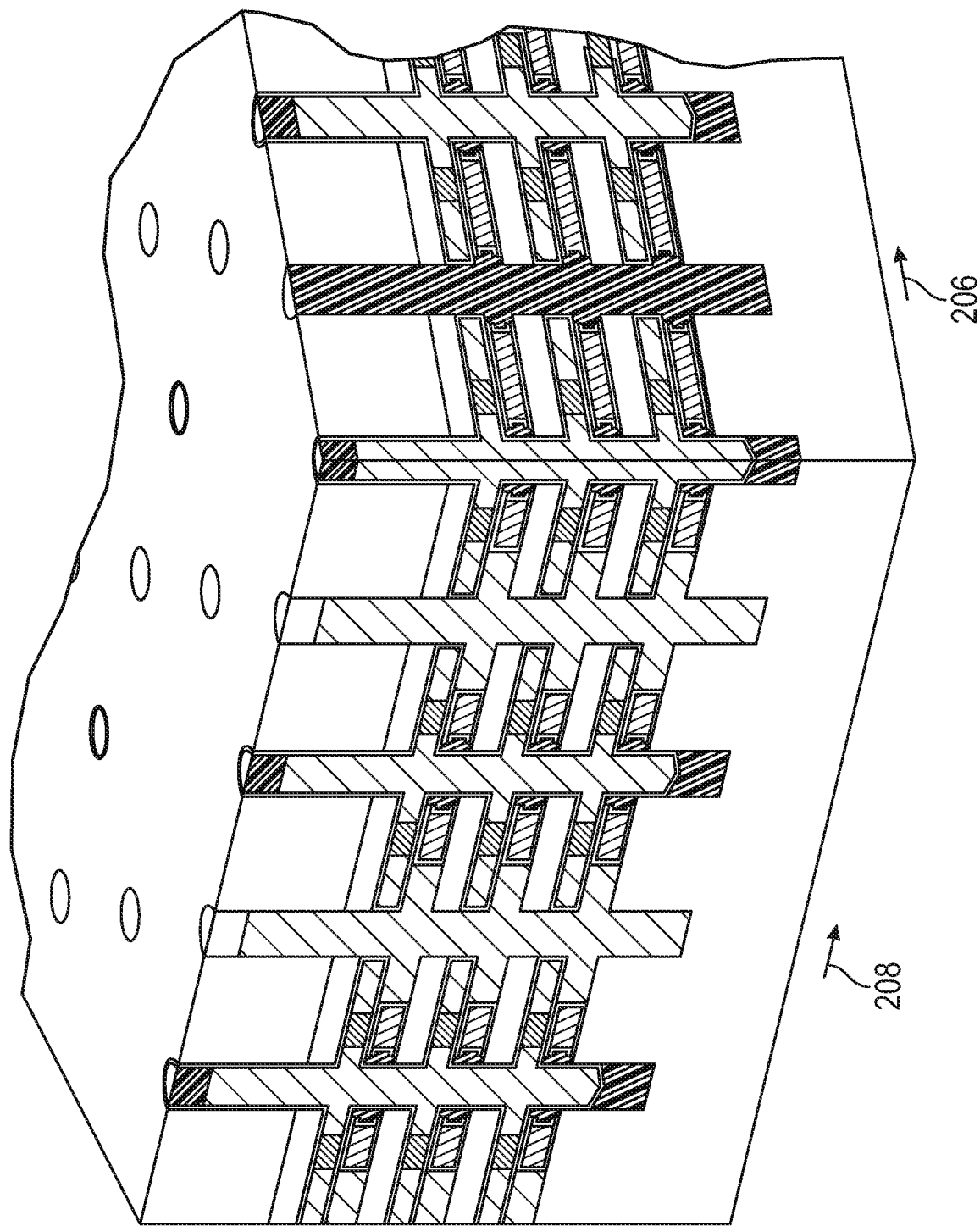
Figure 40:
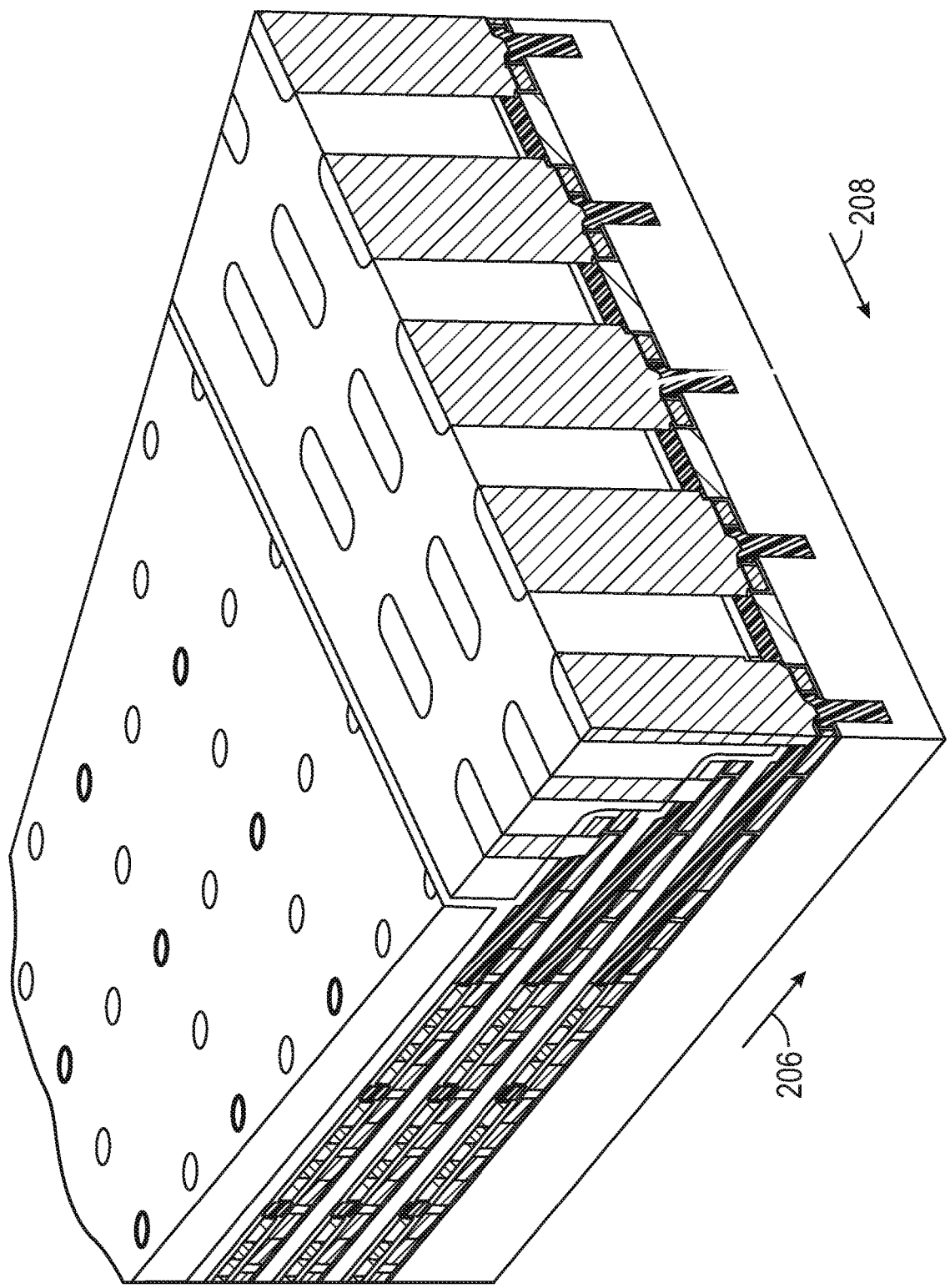

The preceding discussion and accompanying drawings illustrate a memory-cell array with double-gated transistors, the disclosed structure and associated fabrication process can be straightforwardly modified for single-gated transistors, as illustrated in FIGS. 38-40.

FIG. 38 shows a layered substrate assembly 3800 with three device tiers 3802 separated by dielectric separation layers 412, where each device tier 3802 includes only two (rather than three) device layers: an electrically conductive device layer 304 and a dielectric device layer 306 disposed thereabove. (Alternatively, the dielectric device layer 306 could be placed below the conductive device layer 304.)

An array of memory cells can be formed in this substrate assembly 3800 using substantially the same process as shown in FIGS. 4-19B, i.e., by forming data-line, dummy, and ground pillars 202, 214, 216, creating ring-shaped transistor channels 310 and capacitor plates 312 in the dielectric device layers 306, and forming transistor gates 314 in the conductive device layers 304. In this embodiment, however, each transistor will have only one gate 314 disposed below the respective transistor channel 310. FIG. 39 shows the resulting device structure.

Following formation of the array of memory cells, electrical connections to the access lines in the various device tiers may be established by creation of a staircase structure, followed by deposition of an oxide fill and creation of metal vias therein. The staircase integration process is significantly simplified, compared with that for embodiments with double-gated transistors. FIG. 40 illustrates the device structure with the electrical connections.

Figure 41:
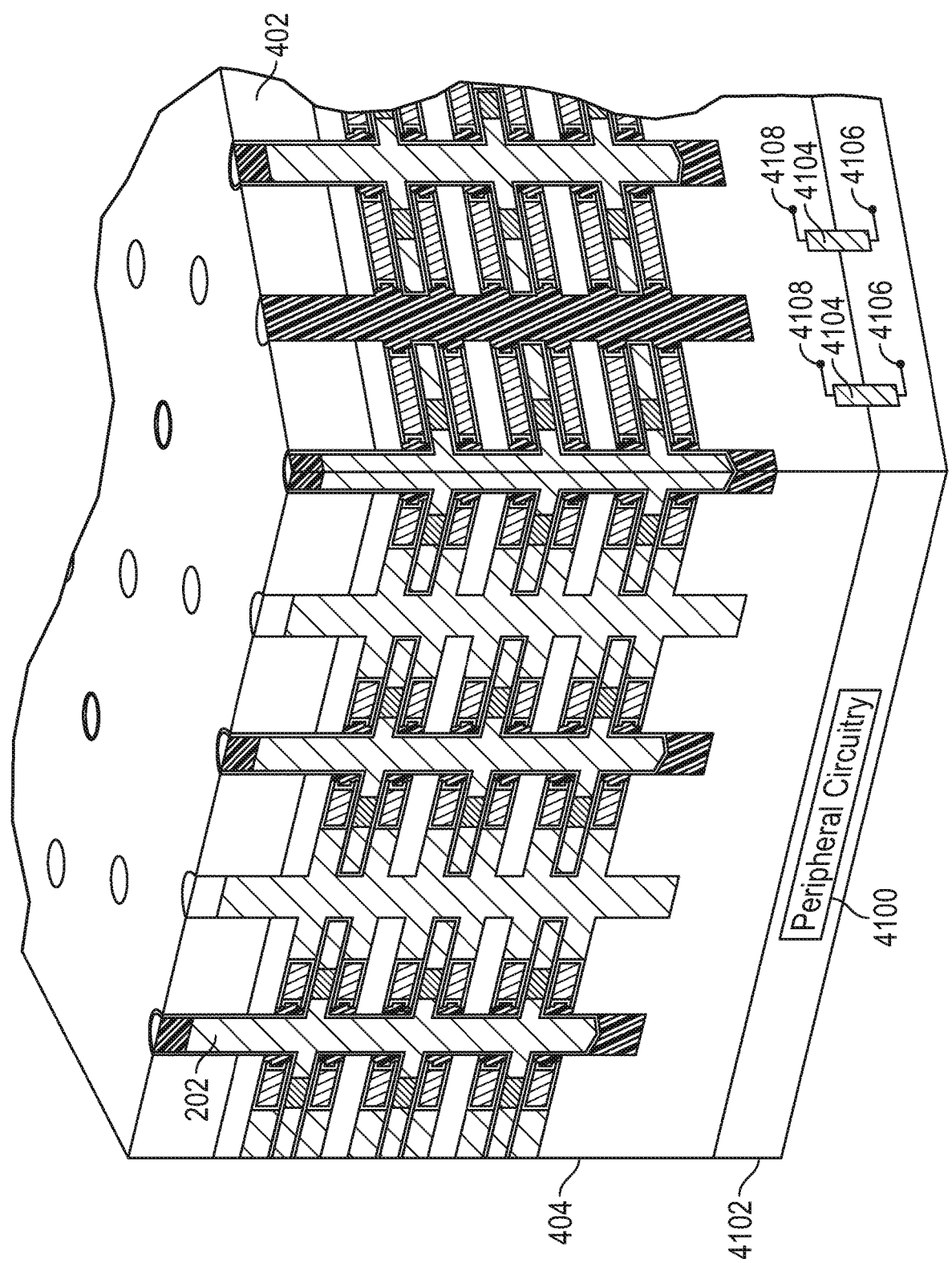
FIG. 41 shows a 3D array of memory cells with peripheral circuitry located beneath the memory array in the substrate assembly, in accordance with some embodiments.

As discussed earlier herein, a memory generally includes, in addition to the array of memory cells, peripheral circuitry, which may, include, e.g., row and column decoders 120, 130, sense amplifier circuitry 124, buffers 126, a memory control unit, input/output circuitry, and so on, as discussed with respect to FIG. 1. Such peripheral circuitry may be formed on the same side of the substrate as, and adjacent, the array of memory cells, or on the backside of the substrate, opposite of the array of memory cells. Alternatively, as conceptually illustrated in FIG. 41, the peripheral circuitry 4100 may, in accordance with some embodiments, be formed at least partially in the substrate 4102, and underneath the 3D DRAM array. For example, various circuit components can have one or more bodies formed within the semiconductor substrate, and other bodies formed in one or more materials or levels formed over the substrate. Through vias 410 and other analogous connections may be connected between respective electrical nodes 4106 of the peripheral circuitry and electrical nodes 4108 in or adjacent the memory array to connect the data-line, access-line, and ground contacts of the 3D RAM array to the peripheral circuitry as needed.

To better illustrate the methods and apparatuses described herein, a non-limiting set of Example embodiments are set forth below as numerically identified Examples.

Example 1 is a three-dimensional DRAM array, comprising: a substrate assembly comprising multiple device-tiers vertically separated from one another by dielectric separation levels, each of the device tiers comprising a dielectric device level and at least one conductive device level vertically adjacent the dielectric device level; electrically conductive data-line pillars vertically extending through at least a portion of the device tiers and the dielectric separation levels, the data-line pillars spaced along multiple first rows; electrically conductive ground pillars vertically extending through at least a portion of the device tiers and the dielectric separation levels, the ground pillars spaced along multiple second rows, the first and second rows both extending in a first horizontal direction and alternating with one another in a second horizontal direction; and memory cells formed within the device tiers, each of the memory cells at least partially surrounding a respective one of the conductive data-line pillars and comprising a transistor and a capacitor electrically connected between that data-line pillar and one or more of the ground pillars, wherein the memory cells comprise rows of memory cells extending in the first horizontal direction, and wherein transistors of the memory cells within each row and within a tier share a common access line.

In Example 2, the subject matter of Example 1 wherein each of the memory cells comprises a transistor channel and a capacitor node plate both formed within a cavity within the dielectric device level of the respective device tier and at least one transistor gate formed within at least one cavity within the at least one conductive device level of the respective device tier.

In Example 3, the subject matter of Example 2 wherein the transistor channel of each cell comprises a semiconductor ring at least partially surrounding the respective conductive data-line pillar, and wherein the capacitor node plate of each cell comprises an electrically conductive ring at least partially surrounding the respective semiconductor ring, the semiconductor ring and the electrically conductive ring both being electrically insulated from the at least one conductive device level.

In Example 4, the subject matter of Example 3 wherein each transistor gate comprises an electrically conductive ring surrounding and electrically insulated from the conductive data-line pillars and electrically insulated from the semiconductor rings and the ground pillars.

In Example 5, the subject matter of any one or more of Examples 2-4 wherein a capacitor area for each of the memory cells is defined by an area of horizontal overlap between the respective node plate and a portion of the at least one conductive device level surrounding the at least one cavity in which the at least one transistor gate is formed.

In Example 6, the subject matter of any one or more of Examples 2-5 wherein the node plates are made of doped polysilicon.

In Example 7, the subject matter of any one or more of Examples 2-6 optionally wherein the cavities formed within the dielectric device levels and the conductive device levels are each lined with a material having a dielectric constant greater than 3.6.

In Example 8, the subject matter of any one or more of Examples 1-7 wherein each device tier comprises the dielectric device level sandwiched between two conductive device levels, and wherein the memory cells comprise double gates.

In Example 9, the subject matter of any one or more of Examples 1-8 wherein each device tier comprises only one conductive device levels adjacent the dielectric device level, and wherein the memory cells comprise single gates.

In Example 10, the subject matter of any one or more of Examples 1-9 optionally include multiple vertical dummy pillars arranged along the first rows alternatingly with the conductive data-line pillars and multiple conductive rings surrounding the dummy pillars to form respective portions of the access lines.

In Example 11, the subject matter of any one or more of Examples 1-10 wherein the data-line pillars are arranged in a parallelogrammic lattice spanned by lattice vectors extending along the first and second horizontal directions.

In Example 12, the subject matter of Example 11 wherein the ground pillars are arranged at center points of edges of the lattice along the second horizontal direction.

In Example 13, the subject matter of any one or more of Examples 1-12 wherein the conductive device levels, the ground pillars, and the data-line pillars comprise doped polysilicon.

In Example 14, the subject matter of any one or more of Examples 1-13 wherein the dielectric device levels comprise silicon oxycarbide and the dielectric separation levels comprise silicon nitride.

In Example 15, the subject matter of any one or more of Examples 1-14 wherein the access lines comprise titanium nitride and tungsten.

Example 16 is a memory cell formed within a substrate comprising a dielectric device level and at least one electrically conductive device level vertically adjacent the dielectric device level, the memory cell comprising: a transistor comprising a semiconductor ring formed within a dielectric device level in electrical contact with a first conductive pillar extending vertically through the dielectric and conductive device levels, the first conductive pillar connected to a source node, and at least one electrically conductive ring forming at least one respective transistor gate within the at least one electrically conductive device level surrounding the first conductive pillar, the transistor gate being electrically insulated from the first conductive pillar and the semiconductor ring and being connected to a gate voltage; and a capacitor comprising a conductive ring forming a capacitor node plate within the dielectric device level at least partially surrounding and in electrical contact with the semiconductor ring, the capacitor node plate being electrically insulated from a second conductive pillar extending through the dielectric and conductive device levels, the second conductive pillar connected to a ground node, and a ground plate formed by portions of the conductive device level electrically connected to the second conductive pillar and horizontally overlapping with the capacitor node plate.

In Example 17, the subject matter of Example 16 wherein the dielectric device level is disposed between two adjacent conductive device levels, and wherein the transistor is double-gated by the two respective electrically conductive rings formed with in the conductive device levels.

In Example 18, the subject matter of any one or more of Examples 16-17 wherein the semiconductor ring and capacitor node plate are both formed within a first cavity surrounding the first conductive pillar; and wherein the transistor gate is formed in a second cavity surrounding the first conductive pillar, the first and second cavities being lined with a material having a dielectric constant greater than a dielectric constant of silicon dioxide.

In Example 19, the subject matter of any one or more of Examples 16-18 wherein the conductive device level, the first and second conductive pillars, and the capacitor node plate are made of doped polysilicon.

In Example 20, the subject matter of any one or more of Examples 16-19 wherein the at least one transistor gate is made of titanium nitride and tungsten.

Example 21 is a method of forming a DRAM array, comprising: forming multiple device-tiers over a substrate, the multiple device tiers vertically separated from one another by dielectric separation levels, each of the device tiers comprising a dielectric device level and at least one conductive device level; forming electrically conductive data-line pillars vertically extending through at least a portion of the device tiers and the dielectric separation levels, the data-line pillars spaced along multiple first rows; forming electrically conductive ground pillars vertically extending through at least a portion of the device tiers and the dielectric separation levels, the ground pillars spaced along multiple second rows, the first and second rows both extending in a first horizontal direction and alternating with one another in a second horizontal direction; and forming memory cells within the device tiers, the memory cells at least partially surrounding a respective one of the conductive data-line pillars, and comprising a transistor and a capacitor coupled between a data-line pillar and one or more of the ground pillars, wherein the memory cells comprise rows of memory cells extending in the first horizontal direction, and wherein transistors of the memory cells within each row and within a conductive device level share a common access line.

In Example 22, the subject matter of Example 21 wherein forming the memory cells comprises: forming a transistor channel and a capacitor node plate within a cavity within the dielectric device level of a respective device tier; and forming at least one transistor gate formed within at least one cavity within the at least one conductive device level of the respective device tier.

In Example 23, the subject matter of Example 22 wherein forming the memory cells comprises: Forming a semiconductor ring formed within a dielectric device level in electrical contact with a first conductive pillar extending vertically through the dielectric and conductive device levels, the first conductive pillar connected to a source node, and forming at least one electrically conductive ring forming at least one respective transistor gate within the at least one electrically conductive device level surrounding the first conductive pillar, the transistor gate being electrically insulated from the first conductive pillar and the semiconductor ring and being connected to a gate voltage; and forming a capacitor comprising, forming a conductive ring forming a capacitor node plate within the dielectric device level at least partially surrounding and in electrical contact with the semiconductor ring, the capacitor node plate being electrically insulated from a second conductive pillar extending through the dielectric and conductive device levels, the second conductive pillar connected to a ground node, and forming a ground plate in portions of the conductive device level electrically connected to the second conductive pillar and horizontally overlapping with the capacitor node plate.

In Example 24, the subject matter of any one or more of Examples 22-23 wherein forming the transistor channel of each cell comprises: forming a semiconductor ring at least partially surrounding the respective conductive data-line pillar, and forming a capacitor node plate comprising an electrically conductive ring at least partially surrounding the respective semiconductor ring, the semiconductor ring and the electrically conductive ring both being electrically insulated from the at least one conductive device level.

In Example 25, the subject matter of Example 24 wherein each transistor gate comprises an electrically conductive ring surrounding and electrically insulated from the conductive data-line pillars and electrically insulated from the semiconductor rings and the ground pillars.

In Example 26, the subject matter of any one or more of Examples 2-25 wherein a capacitor area for each of the memory cells is defined by an area of horizontal overlap between the respective node plate and a portion of the at least one conductive device level surrounding the at least one cavity in which the at least one transistor gate is formed.

In Example 27, the subject matter of any one or more of Examples 2-26 wherein the node plates comprise doped polysilicon.

In Example 28, the subject matter of any one or more of Examples 2-27 wherein the cavities formed within the dielectric device levels and the conductive device levels are each lined with a material having a dielectric constant greater than 3.6.

In Example 29, the subject matter of any one or more of Examples 1-28 wherein each device tier comprises the dielectric device level sandwiched between two conductive device levels, and wherein forming the memory cells comprises forming double gates of the transistors.

In Example 30, the subject matter of any one or more of Examples 21-29 wherein each device tier comprises only one conductive device level adjacent the dielectric device level, and wherein the memory cells comprise single gates.

In Example 31, the subject matter of any one or more of Examples 21-30 optionally include forming multiple vertical dummy pillars arranged along the first rows alternatingly with the conductive data-line pillars; and forming multiple conductive rings surrounding the dummy pillars to form respective portions of the access lines.

In Example 32, the subject matter of any one or more of Examples 21-31 wherein the data-line pillars are arranged in a parallelogrammic lattice spanned by lattice vectors extending along the first and second horizontal directions.

In Example 33, the subject matter of any one or more of Examples 21-32 wherein the ground pillars are arranged at center points of edges of the lattice along the second horizontal direction.

In Example 34, the subject matter of any one or more of Examples 21-33 wherein the conductive device levels, the ground pillars, and the data-line pillars comprise doped polysilicon.

In Example 35, the subject matter of any one or more of Examples 1-34 wherein the dielectric device levels comprise silicon oxycarbide and the dielectric separation levels comprise silicon nitride.

In Example 36, the subject matter of any one or more of Examples 1-35 wherein the access lines comprise titanium nitride and tungsten.

In Example 37 any one or more of the example 3-dimensional DRAM arrays of Examples 1-15 may be constructed through the methods of any of Examples 21-36.

In Example 38, any one or more of the example 3-dimensional DRAM arrays of examples 1-15 may include one or more memory cells in accordance with any of any of Examples 16-20.

In Example 39, any one or more of the devices of any of Examples 1-20 may be incorporated into a system including a processor and other structures.

In Example 40, any of the additional processes, sequences of operation, and materials described herein may be utilized in any of the methods of Examples 21-36.

In ex. 41, any of the additional processes, sequences of operation, and materials described herein may incorporated in the structure or formation of any of Examples 1-20.

The preceding illustrations of 3D memory arrays are intended to provide a general understanding of the structure of various embodiments and not a complete description of all the elements and features of the devices that might make use of the structures described herein.

The 3D memory array device of various embodiments may include or be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multi-chip modules. Such apparatus may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon studying and understanding the above description.

The Abstract is provided to comply with 37 C.F.R. § 1.72(b) requiring an abstract that will allow the reader to quickly ascertain the nature and gist of the technical disclosure. The Abstract of the Disclosure is submitted with the understanding that it will not be used to interpret or limit the scope or meaning of the claims.

What is claimed is:

1. A three-dimensional DRAM array, comprising:
a substrate assembly comprising multiple device-tiers vertically separated from one another by dielectric separation levels, each of the device tiers comprising a dielectric device level and at least one conductive device level vertically adjacent the dielectric device level;
electrically conductive data-line pillars vertically extending through at least a portion of the device tiers and the dielectric separation levels, the data-line pillars spaced along multiple first rows;
electrically conductive ground pillars vertically extending through at least a portion of the device tiers and the dielectric separation levels, the ground pillars spaced along multiple second rows, the first and second rows both extending in a first horizontal direction and alternating with one another in a second horizontal direction, wherein the first rows do not include ground pillars and the second rows do not include data-line pillars; and
memory cells formed within the device tiers, each of the memory cells at least partially surrounding a respective one of the conductive data-line pillars and comprising a transistor and a capacitor electrically connected between that data-line pillar and one or more of the ground pillars, the data-line pillars corresponding to data lines to supply a source voltage to the transistors, and the ground pillars to be coupled to a reference voltage,
wherein the memory cells comprise rows of memory cells extending in the first horizontal direction, and wherein transistors of the memory cells within each row and within a tier share a common access line.

2. The DRAM array of claim 1, wherein each of the memory cells comprises a transistor channel and a capacitor node plate both formed within a cavity within the dielectric device level of the respective device tier and at least one transistor gate formed within at least one cavity within the at least one conductive device level of the respective device tier.

3. The DRAM array of claim 2, wherein the transistor channel of each cell comprises a semiconductor ring at least partially surrounding the respective conductive data-line pillar, and wherein the capacitor node plate of each cell comprises an electrically conductive ring at least partially surrounding the respective semiconductor ring, the semiconductor ring and the electrically conductive ring both being electrically insulated from the at least one conductive device level.

4. The DRAM array of claim 3, wherein each transistor gate comprises an electrically conductive ring surrounding and electrically insulated from the conductive data-line pillars and electrically insulated from the semiconductor rings and the ground pillars.

5. The DRAM array of claim 2, wherein a capacitor area for each of the memory cells is defined by an area of horizontal overlap between the respective node plate and a portion of the at least one conductive device level surrounding the at least one cavity in which the at least one transistor gate is formed.

6. The DRAM array of claim 2, wherein the node plates are made of doped polysilicon.

7. The DRAM array of claim 2, wherein the cavities formed within the dielectric device levels and the conductive device levels are each lined with a material having a dielectric constant greater than 3.6.

8. The DRAM array of claim 1, wherein each device tier comprises the dielectric device level sandwiched between two conductive device levels, and wherein the memory cells comprise double gates.

9. The DRAM array of claim 1, wherein each device tier comprises only one conductive device levels adjacent the dielectric device level, and wherein the memory cells comprise single gates.

10. The DRAM array of claim 1, further comprising multiple vertical dummy pillars arranged along the first rows alternatingly with the conductive data-line pillars and multiple conductive rings surrounding the dummy pillars to form respective portions of the access lines.

11. The DRAM array of claim 1, wherein the conductive device levels, the ground pillars, and the data-line pillars comprise doped polysilicon.

12. The DRAM array of claim 1, wherein the dielectric device levels comprise silicon oxycarbide and the dielectric separation levels comprise silicon nitride.

13. The DRAM array of claim 1, wherein the access lines comprise titanium nitride and tungsten.

14. A memory cell formed within a substrate comprising a dielectric device level and at least one electrically conductive device level vertically adjacent the dielectric device level, the memory cell comprising:
a transistor comprising,
a semiconductor ring formed within a dielectric device level in electrical contact with a first conductive pillar extending vertically through the dielectric and conductive device levels, the first conductive pillar connected to a source node, and
at least one electrically conductive ring forming at least one respective transistor gate within the at least one electrically conductive device level surrounding the first conductive pillar, the transistor gate being electrically insulated from the first conductive pillar and the semiconductor ring and being connected to a gate voltage; and
a capacitor comprising
a conductive ring forming a capacitor node plate within the dielectric device level at least partially surrounding and in electrical contact with the semiconductor ring, the capacitor node plate being electrically insulated from a second conductive pillar extending through the dielectric and conductive device levels, the second conductive pillar connected to a ground node, and a ground plate formed by portions of the conductive device level electrically connected to the second conductive pillar and horizontally overlapping with the capacitor node plate.

15. The memory cell of claim 14, wherein the dielectric device level is disposed between two adjacent conductive device levels, and wherein the transistor is double-gated by the two respective electrically conductive rings formed within the conductive device levels.

16. The memory cell of claim 14, wherein the at least one transistor gate is made of titanium nitride and tungsten.

17. A method of forming a DRAM array, comprising:
forming multiple device-tiers over a substrate, the multiple device tiers vertically separated from one another by dielectric separation levels, each of the device tiers comprising a dielectric device level and at least one conductive device level;
forming electrically conductive data-line pillars vertically extending through at least a portion of the device tiers and the dielectric separation levels, the data-line pillars spaced along multiple first rows;
forming electrically conductive ground pillars vertically extending through at least a portion of the device tiers and the dielectric separation levels, the ground pillars spaced along multiple second rows, the first and second rows both extending in a first horizontal direction and alternating with one another in a second horizontal direction, the first rows do not include ground pillars and the second rows do not include data-line pillars; and
forming memory cells within the device tiers, the memory cells at least partially surrounding a respective one of the conductive data-line pillars, and comprising a transistor and a capacitor coupled between a data-line pillar and one or more of the ground pillars, the data-line pillars corresponding to data lines to supply a source voltage to the transistors, and the ground pillars to be coupled to a reference voltage,
wherein the memory cells comprise rows of memory cells extending in the first horizontal direction, and wherein transistors of the memory cells within each row and within a conductive device level share a common access line.

18. The method of claim 17, wherein forming the memory cells comprises:
forming a transistor channel and a capacitor node plate within a cavity within the dielectric device level of a respective device tier; and
forming at least one transistor gate formed within at least one cavity within the at least one conductive device level of the respective device tier.

19. The method of claim 18, wherein forming the memory cells comprises:
forming each transistor by:
forming a semiconductor ring forming the transistor channel within the dielectric device level in electrical contact with a first conductive pillar extending vertically through the dielectric and conductive device levels, the first conductive pillar connected to a source node,
forming at least one electrically conductive ring forming the at least one transistor gate within the at least one electrically conductive device level surrounding the first conductive pillar, the at least one transistor gate being electrically insulated from the first conductive pillar and the semiconductor ring and being connected to a gate voltage; and forming each capacitor by:
forming a conductive ring forming the capacitor node plate within the dielectric device level at least partially surrounding and in electrical contact with the semiconductor ring, the capacitor node plate being electrically insulated from a second conductive pillar extending through the dielectric and conductive device levels, the second conductive pillar connected to a ground node, and
forming a ground plate in portions of the conductive device level electrically connected to the second conductive pillar and horizontally overlapping with the capacitor node plate.

20. The method of claim 18, wherein:
forming the transistor channel of each cell comprises forming a semiconductor ring at least partially surrounding the respective conductive data-line pillar, and
forming the capacitor node plate of each cell comprises forming an electrically conductive ring at least partially surrounding the respective semiconductor ring, the semiconductor ring and the electrically conductive ring both being electrically insulated from the at least one conductive device level.

21. The method of claim 20, wherein a capacitor area for each of the memory cells is defined by an area of horizontal overlap between the respective node plate and a portion of the at least one conductive device level surrounding the at least one cavity in which the at least one transistor gate is formed.

22. The method of claim 21, wherein each device tier comprises the dielectric device level sandwiched between two conductive device levels, and wherein forming the memory cells comprises forming double gates of the transistors.

23. The method of claim 17, wherein each device tier comprises only one conductive device level adjacent the dielectric device level, and wherein the memory cells comprise single gates.

24. The method of claim 17, further comprising:
forming multiple vertical dummy pillars arranged along the first rows alternatingly with the conductive data-line pillars; and
forming multiple conductive rings surrounding the dummy pillars to form respective portions of the access lines.

* * * * *